(12) United States Patent
Warren et al.

(10) Patent No.: US 10,816,231 B2
(45) Date of Patent: *Oct. 27, 2020

(54) SMART-HOME DEVICE TELEMETRY CIRCUITS FOR DETECTING ELECTRICAL ANOMALIES IN A POPULATION OF DEVICES

(71) Applicant: Google LLC, Mountain View, CA (US)

(72) Inventors: Daniel Adam Warren, San Francisco, CA (US); Eric Marschalkowski, Munich (DE)

(73) Assignee: Google LLC, Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/736,255

(22) Filed: Jan. 7, 2020

(65) Prior Publication Data

US 2020/0141599 A1    May 7, 2020

Related U.S. Application Data

(63) Continuation of application No. 15/680,670, filed on Aug. 18, 2017, now Pat. No. 10,557,640.

(51) Int. Cl.
  *F24F 11/30* (2018.01)
  *G01R 19/165* (2006.01)
  (Continued)

(52) U.S. Cl.
  CPC .............. *F24F 11/30* (2018.01); *F24F 11/62* (2018.01); *G01R 19/16533* (2013.01); *G05B 15/02* (2013.01); *F24F 11/32* (2018.01); *F24F 11/52* (2018.01); *F24F 11/58* (2018.01); *F24F 2110/10* (2018.01); *F24F 2140/50* (2018.01); *G01R 31/3277* (2013.01);
  (Continued)

(58) Field of Classification Search
  CPC .. F24F 11/30; F24F 11/62; F24F 11/32; F24F 11/52; F24F 11/58; F24F 2140/50; F24F 2110/10; G01R 19/16533; G05B 15/02; H04L 12/2814; H04L 12/2823
  See application file for complete search history.

(56) References Cited

U.S. PATENT DOCUMENTS 10,557,640 B2 * 2/2020 Warren .................... F24F 11/30
2016/0195294 A1   7/2016 Conner et al.

* cited by examiner

*Primary Examiner* — Clayton E. LaBalle
*Assistant Examiner* — Michael A Harrison
(74) *Attorney, Agent, or Firm* — Kilpatrick Townsend & Stockton LLP

(57) ABSTRACT

A smart-home device may include a solid state relay (SSR) switching integrated circuit (IC). SSR switching IC may include switching elements configured to open and close a connection between a power wire and a return wire of an environmental system; a voltage sensor that measures a voltage across the one or more switching elements; a current sensor that measures a current through the one or more switching elements; and a temperature sensor that measures a temperature near the one or more switching elements. The smart-home device may also include a wireless communication device that periodically receives voltage, current, or temperature data originating from the SSR switching IC and transmits the voltage, current, or temperature data to a device management server. The device management server may receive batches of voltage, current, or temperature data from a plurality of smart-home devices.

20 Claims, 25 Drawing Sheets

(51) Int. Cl.
G05B 15/02 (2006.01)
F24F 11/62 (2018.01)
*H04L 12/28* (2006.01)
*F24F 140/50* (2018.01)
*F24F 11/52* (2018.01)
*F24F 11/58* (2018.01)
*F24F 110/10* (2018.01)
*F24F 11/32* (2018.01)
*G01R 31/327* (2006.01)

(52) U.S. Cl.
CPC .. *G05B 2219/2642* (2013.01); *H04L 12/2814* (2013.01); *H04L 12/2823* (2013.01)

SMART-HOME DEVICE TELEMETRY CIRCUITS FOR DETECTING ELECTRICAL ANOMALIES IN A POPULATION OF DEVICES

CROSS-REFERENCE TO RELATED APPLICATIONS

This application is a continuation of U.S. patent application Ser. No. 15/680,670, filed Aug. 18, 2017, the full disclosure of which is incorporated herein by reference.

TECHNICAL FIELD

This patent specification relates to systems, methods, and related computer program products for the monitoring and control of energy-consuming systems or other resource-consuming systems. More particularly, this specification relates to monitoring and recoverable protection of circuitry in smart-home devices, such as thermostats.

BACKGROUND

During the installation or subsequent upgrade of an HVAC system, there are occasions when wires may be incorrectly connected to various components of the HVAC system, including an electronic thermostat. When wires are incorrectly connected to a thermostat, there is the possibility for a short circuit to be created that if not accounted for could result in permanent damage to either the thermostat, the HVAC wiring and/or other HVAC system components. In order to protect against such conditions, the electronic thermostat can include one or more fuses that are designed to blow under the increased current of a short circuit condition. However, blown fuses are problematic from support and customer satisfaction viewpoint. The problem of blown fuses can be particularly problematic for thermostats during installation, and problems can be difficult to diagnose and remedy.

Additionally, switching circuitry in a thermostat can also be used to actuate, or activate, HVAC functions, such as air conditioning, heating, and/or fan operations. When a common ("C") wire is not available, modern advanced thermostats may steal power from HVAC call signal wires at levels low enough to not interfere with normal HVAC functions, but high enough to charge an energy storage element, such as a rechargeable battery or large capacitor. Thus, modern thermostat designers should design switching circuitry that can both protect the thermostat from voltage/current anomalies while still enabling power stealing functionality.

BRIEF SUMMARY

In some embodiments, a smart-home device may include an energy-storage element that stores energy that is harvested from an environmental system, a power wire connector and a return wire connector, and a solid state relay (SSR) switching integrated circuit (IC). The SSR switching IC may include one or more switching elements configured to operate in a first operating state in which the one or more switching elements create a connection between the power wire connector and the return wire connector, and a second operating state in which the one or more switching elements interrupt the connection between the power wire connector and the return wire connector. The SSR switching IC may also include a digital control circuit that controls the one or more switching elements. The digital control circuit may be configured to cause the one or more switching elements to operate in the first operating state to activate an environmental function of the environmental system, and determine that an electrical property of the energy-storage element has dropped below a first threshold while the one or more switching elements operate in the first operating state. The digital control circuit may also be configured to, in response to determining that the electrical property of the energy-storage element has dropped below the first threshold, cause the one or more switching elements to operate in the second operating state. The digital control circuit may be additionally configured to harvest energy from the environmental system while the one or more switching elements operate in the second operating state, determine that a first time has elapsed since the one or more switching elements began operating in the second operating state, and, in response to determining that the first time has elapsed since the one or more switching elements began operating in the second operating state, cause the one or more switching elements to operate in the first operating state.

In any embodiment, one or more of the following features may be implemented in any combination and without limitation. The first time may be short enough in duration that execution of the environmental function of the environmental system is not interrupted. The SSR switching IC may further include a monitoring circuit that receives a signal indicating an electrical characteristic of the energy-storage element. The SSR switching IC may further include one or more references coupled to one or more comparators, where the one or more comparators may determine how the electrical characteristic of the energy-storage element compares to the one or more references. The digital control circuit may be further configured to, while harvesting energy from the environmental system when the one or more switching elements operate in the second operating state, monitor the electrical property of the energy-storage element to determine if the electrical property of the energy-storage element has risen above a second threshold. The one or more switching elements may include a pair of field-effect transistors (FETs). The SSR switching IC may further include a serial bus interface. Causing the one or more switching elements to operate in the first operating state to activate the environmental function of the environmental system may occur in response to receiving a command to activate the environmental function, where the command may be received from a smart-home-device processor that is not part of the SSR switching IC via the serial bus interface. The smart-home device may include a thermostat, and the environmental system may include a heating, ventilation, and air conditioning (HVAC) system. The SSR switching IC may be packaged in a physical chip that is separate from the energy-storage element.

In some embodiments, a smart-home device may include a rectifier circuit providing a rectified DC signal, a rechargeable energy-storage element, and a power-management integrated circuit (PMIC). The PMIC may include a charging circuit for the rechargeable energy-storage element, a current-sensing circuit that measures a current provided by the rectified DC signal, a programmable current limit, a voltage-sensing circuit that measures a voltage on the rechargeable energy-storage element, and a controller that regulates the current provided to a DC output of the PMIC. The current output may be regulated based at least in part on the current provided by the rectified DC signal a DC output, the programmable current limit, and the voltage on the rechargeable energy-storage element. The DC output of the PMIC may provide energy to (i) a plurality of other energy-consuming systems on the smart-home device, and (ii) the charging circuit for the rechargeable energy-storage element.

In any embodiment, one or more of the following features may be implemented in any combination and without limitation. The DC output of the PMIC may be coupled through an inductor to a storage capacitor. The controller may regulate the current provided to a DC output by controlling a timing of a voltage applied to a gate of a transistor that is connected in series between the rectified DC signal and the DC output. The timing of the voltage applied to the gate of the transistor may cause the transistor to act as a buck converter for the DC output. The controller may include a pulse-width modulated (PWM) controller that regulates a pulse width of the voltage applied to the gate of the transistor. The controller may include a pulse-frequency modulation (PFM) controller or a constant on-time (COT) controller. The plurality of other energy-consuming systems on the smart-home device includes a plurality of DC/DC voltage converters. The controller may cause the DC output to provide at least a minimum voltage when the voltage on the rechargeable energy-storage element falls below the minimum voltage. The minimum voltage may correspond to a minimum required voltage of at least one of the plurality of other energy-consuming systems on the smart-home device. The controller may regulate the voltage of the DC output to be one voltage drop higher than a desired voltage on the rechargeable energy-storage element.

In some embodiments, a smart-home device may include a solid state relay (SSR) switching integrated circuit (IC). SSR switching IC may include one or more switching elements configured to open and close a connection between a power wire and a return wire of an environmental system; a voltage sensor that measures a voltage across the one or more switching elements; a current sensor that measures a current through the one or more switching elements; and a temperature sensor that measures a temperature near the one or more switching elements. The smart-home device may also include a wireless communication device that periodically receives voltage, current, or temperature data originating from the SSR switching IC and transmits the voltage, current, or temperature data to a device management server. The device management server may receive batches of voltage, current, or temperature data from a plurality of smart-home devices.

In some embodiments, a method of monitoring and correcting electrical anomalies in a smart-home device may include opening or closing a connection between a power wire and a return wire of an environmental system using one or more switching elements of a solid state relay (SSR) switching integrated circuit (IC) on the smart-home device. The method may also include measuring a voltage across the one or more switching elements using a voltage sensor of the SSR switching IC, measuring a current through the one or more switching elements using a current sensor of the SSR switching IC, or measuring a temperature near the one or more switching elements using a temperature sensor of the SSR switching IC. The method may additionally include transmitting voltage, current, or temperature data originating from the SSR switching IC to a device management server using a wireless communication device of the smart-home device. The device management server may receive batches of voltage, current, or temperature data from a plurality of smart-home devices.

In any embodiment, one or more of the following features may be implemented in any combination and without limitation. The SSR switching IC further comprises a analog-to-digital converter (ADC) and a multiplexer, wherein outputs from the voltage sensor, the current sensor, and the temperature sensor are individually selected by the multiplexer for conversion by the ADC. The SSR switching IC may further include a memory that stores at least 20 ms of voltage, current, and temperature data. The smart-home device may further include a main processor, where the SSR switching IC may periodically transfer the voltage, current, or temperature data from the memory of the SSR switching IC to the main processor, and the main processor may periodically transfer the voltage, current, or temperature data to the wireless communication device. The one or more switching elements may be configured to connect to a first transformer of the environmental system. The SSR switching IC may further include second one or more switching elements configured to connect to a second transformer of the environmental system. The first transformer and the second transformer may be 180° out of phase. The SSR switching IC may further include a threshold detection circuit wherein the voltage, current, or temperature data originating from the SSR switching IC is collected in response to a detected threshold violation. The voltage, current, or temperature data may indicate an over-current or over-voltage event. The wireless communication device may receive a software update from the device management server for operation of the SSR switching IC to correct the over-current or over-voltage event.

DETAILED DESCRIPTION

The Smart-Home Environment

Figure 1:
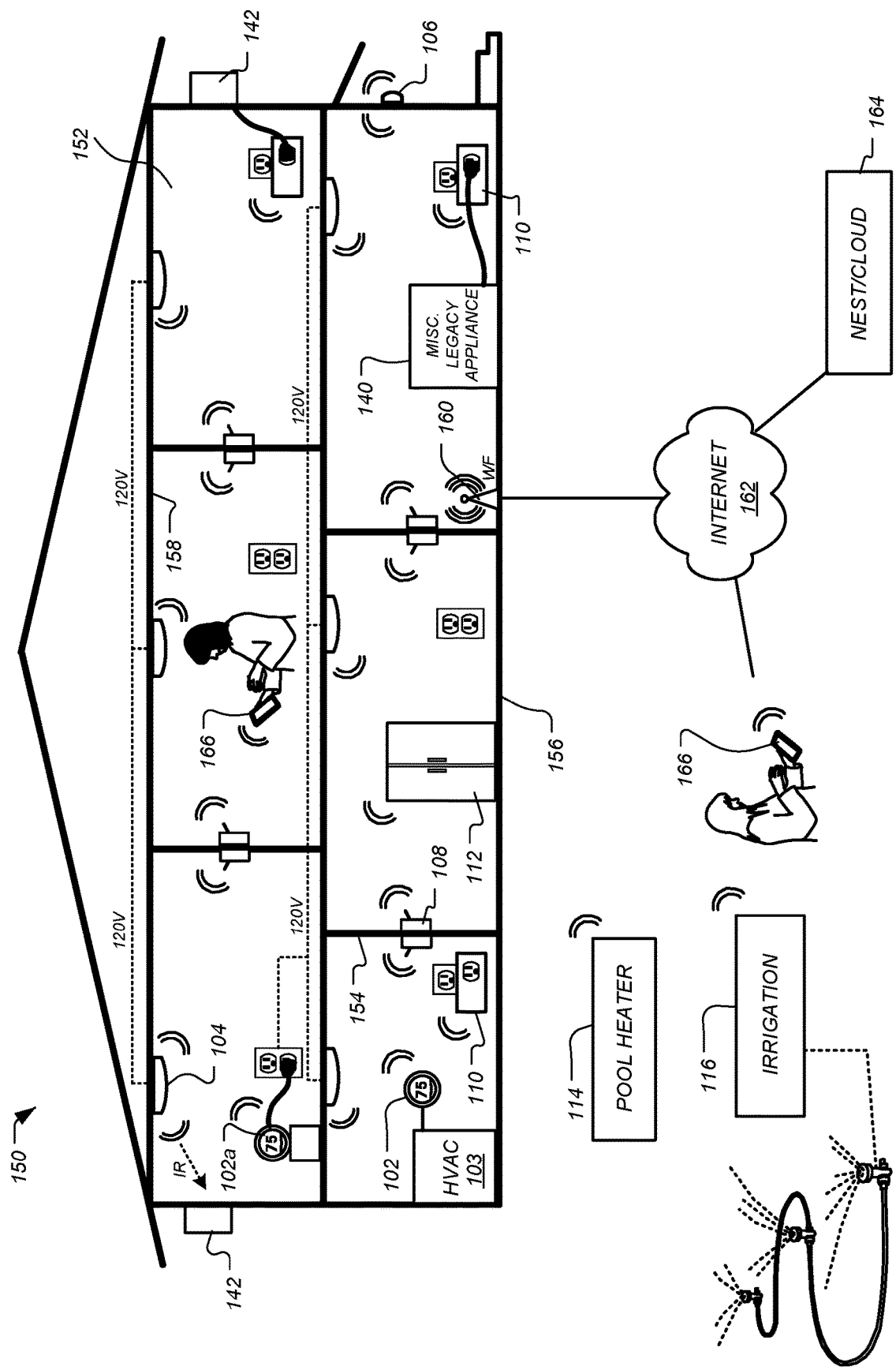
FIG. 1 illustrates an example of a smart home environment within which one or more of the devices, methods, systems, services, and/or computer program products described further herein can be applicable.

A detailed description of the inventive body of work is provided herein. While several embodiments are described, it should be understood that the inventive body of work is not limited to any one embodiment, but instead encompasses numerous alternatives, modifications, and equivalents. In addition, while numerous specific details are set forth in the following description in order to provide a thorough understanding of the inventive body of work, some embodiments can be practiced without some or all of these details. Moreover, for the purpose of clarity, certain technical material that is known in the related art has not been described in detail in order to avoid unnecessarily obscuring the inventive body of work.

As used herein the term "HVAC" includes systems providing both heating and cooling, heating only, cooling only, as well as systems that provide other occupant comfort and/or conditioning functionality such as humidification, dehumidification and ventilation. Generally an HVAC system is one of many possible environmental control systems that can be used in conjunction with the embodiments described herein. Other environmental control systems may include security systems, sprinkler monitoring systems, smart home appliances, smart home environments, intercom systems, and so forth.

As used herein the terms power "harvesting," "sharing" and "stealing" when referring to HVAC thermostats all refer to thermostats that are designed to derive power from the power transformer through the equipment load without using a direct or common wire source directly from the transformer.

As used herein the term "residential" when referring to an HVAC system means a type of HVAC system that is suitable to heat, cool and/or otherwise condition the interior of a building that is primarily used as a single family dwelling. An example of a cooling system that would be considered residential would have a cooling capacity of less than about 5 tons of refrigeration (1 ton of refrigeration=12,000 Btu/h).

As used herein the term "light commercial" when referring to an HVAC system means a type of HVAC system that is suitable to heat, cool and/or otherwise condition the interior of a building that is primarily used for commercial purposes, but is of a size and construction that a residential HVAC system is considered suitable. An example of a cooling system that would be considered residential would have a cooling capacity of less than about 5 tons of refrigeration.

As used herein the term "thermostat" means a device or system for regulating parameters such as temperature and/or humidity within at least a part of an enclosure. The term "thermostat" may include a control unit for a heating and/or cooling system or a component part of a heater or air conditioner. As used herein the term "thermostat" can also refer generally to a versatile sensing and control unit (VSCU unit) that is configured and adapted to provide sophisticated, customized, energy-saving HVAC control functionality while at the same time being visually appealing, non-intimidating, elegant to behold, and delightfully easy to use.

FIG. 1 illustrates an example of a smart home environment within which one or more of the devices, methods, systems, services, and/or computer program products described further herein can be applicable. The depicted smart home environment includes a structure 150, which can include, e.g., a house, office building, garage, or mobile home. It will be appreciated that devices can also be integrated into a smart home environment that does not include an entire structure 150, such as an apartment, condominium, or office space. Further, the smart home environment can control and/or be coupled to devices outside of the actual structure 150. Indeed, several devices in the smart home environment need not physically be within the structure 150 at all. For example, a device controlling a pool heater or irrigation system can be located outside of the structure 150.

The depicted structure 150 includes a plurality of rooms 152, separated at least partly from each other via walls 154. The walls 154 can include interior walls or exterior walls. Each room can further include a floor 156 and a ceiling 158. Devices can be mounted on, integrated with and/or supported by a wall 154, floor or ceiling.

The smart home depicted in FIG. 1 includes a plurality of devices, including intelligent, multi-sensing, network-connected devices that can integrate seamlessly with each other and/or with cloud-based server systems to provide any of a variety of useful smart home objectives. One, more or each of the devices illustrated in the smart home environment and/or in the figure can include one or more sensors, a user interface, a power supply, a communications component, a modularity unit and intelligent software as described herein. Examples of devices are shown in FIG. 1.

An intelligent, multi-sensing, network-connected thermostat 102 can detect ambient climate characteristics (e.g., temperature and/or humidity) and control a heating, ventilation and air-conditioning (HVAC) system 103. One or more intelligent, network-connected, multi-sensing hazard detection units 104 can detect the presence of a hazardous substance and/or a hazardous condition in the home environment (e.g., smoke, fire, or carbon monoxide). One or more intelligent, multi-sensing, network-connected entryway interface devices 106, which can be termed a "smart doorbell", can detect a person's approach to or departure from a location, control audible functionality, announce a person's approach or departure via audio or visual means, or control settings on a security system (e.g., to activate or deactivate the security system).

Each of a plurality of intelligent, multi-sensing, network-connected wall light switches 108 can detect ambient lighting conditions, detect room-occupancy states and control a power and/or dim state of one or more lights. In some instances, light switches 108 can further or alternatively control a power state or speed of a fan, such as a ceiling fan. Each of a plurality of intelligent, multi-sensing, network-connected wall plug interfaces 110 can detect occupancy of a room or enclosure and control supply of power to one or more wall plugs (e.g., such that power is not supplied to the plug if nobody is at home). The smart home may further include a plurality of intelligent, multi-sensing, network-connected appliances 112, such as refrigerators, stoves and/or ovens, televisions, washers, dryers, lights (inside and/or outside the structure 150), stereos, intercom systems, garage-door openers, floor fans, ceiling fans, whole-house fans, wall air conditioners, pool heaters 114, irrigation systems 116, security systems (including security system components such as cameras, motion detectors and window/door sensors), and so forth. While descriptions of FIG. 1 can identify specific sensors and functionalities associated with specific devices, it will be appreciated that any of a variety of sensors and functionalities (such as those described throughout the specification) can be integrated into the device.

In addition to containing processing and sensing capabilities, each of the devices 102, 104, 106, 108, 110, 112, 114 and 116 can be capable of data communications and information sharing with any other of the devices 102, 104, 106, 108, 110, 112, 114 and 116, as well as to any cloud server or any other device that is network-connected anywhere in the world. The devices can send and receive communications via any of a variety of custom or standard wireless protocols (Wi-Fi, ZigBee, 6LoWPAN, Thread, Bluetooth, BLE, HomeKit Accessory Protocol (HAP), Weave, etc.) and/or any of a variety of custom or standard wired protocols (CAT6 Ethernet, HomePlug, etc.). Each of the devices 102, 104, 106, 108, 110, 112, 114 and 116 may also be capable of receiving voice commands or other voice-based inputs from a user, such as the Google Home® interface. The wall plug interfaces 110 can serve as wireless or wired repeaters, and/or can function as bridges between (i) devices plugged into AC outlets and communicating using Homeplug or other power line protocol, and (ii) devices that not plugged into AC outlets.

For example, a first device can communicate with a second device via a wireless router 160. A device can further communicate with remote devices via a connection to a network, such as the Internet 162. Through the Internet 162, the device can communicate with a central server or a cloud-computing system 164. The central server or cloud-computing system 164 can be associated with a manufacturer, support entity or service provider associated with the device. For one embodiment, a user may be able to contact customer support using a device itself rather than needing to use other communication means such as a telephone or Internet-connected computer. Further, software updates can be automatically sent from the central server or cloud-computing system 164 to devices (e.g., when available, when purchased, or at routine intervals).

By virtue of network connectivity, one or more of the smart-home devices of FIG. 1 can further allow a user to interact with the device even if the user is not proximate to the device. For example, a user can communicate with a device using a computer (e.g., a desktop computer, laptop computer, or tablet) or other portable electronic device (e.g., a smartphone). A webpage or app can be configured to receive communications from the user and control the device based on the communications and/or to present information about the device's operation to the user. For example, the user can view a current setpoint temperature for a device and adjust it using a computer. The user can be in the structure during this remote communication or outside the structure.

The smart home also can include a variety of non-communicating legacy appliances 140, such as old conventional washer/dryers, refrigerators, and the like which can be controlled, albeit coarsely (ON/OFF), by virtue of the wall plug interfaces 110. The smart home can further include a variety of partially communicating legacy appliances 142, such as IR-controlled wall air conditioners or other IR-controlled devices, which can be controlled by IR signals provided by the hazard detection units 104 or the light switches 108.

Figure 2:
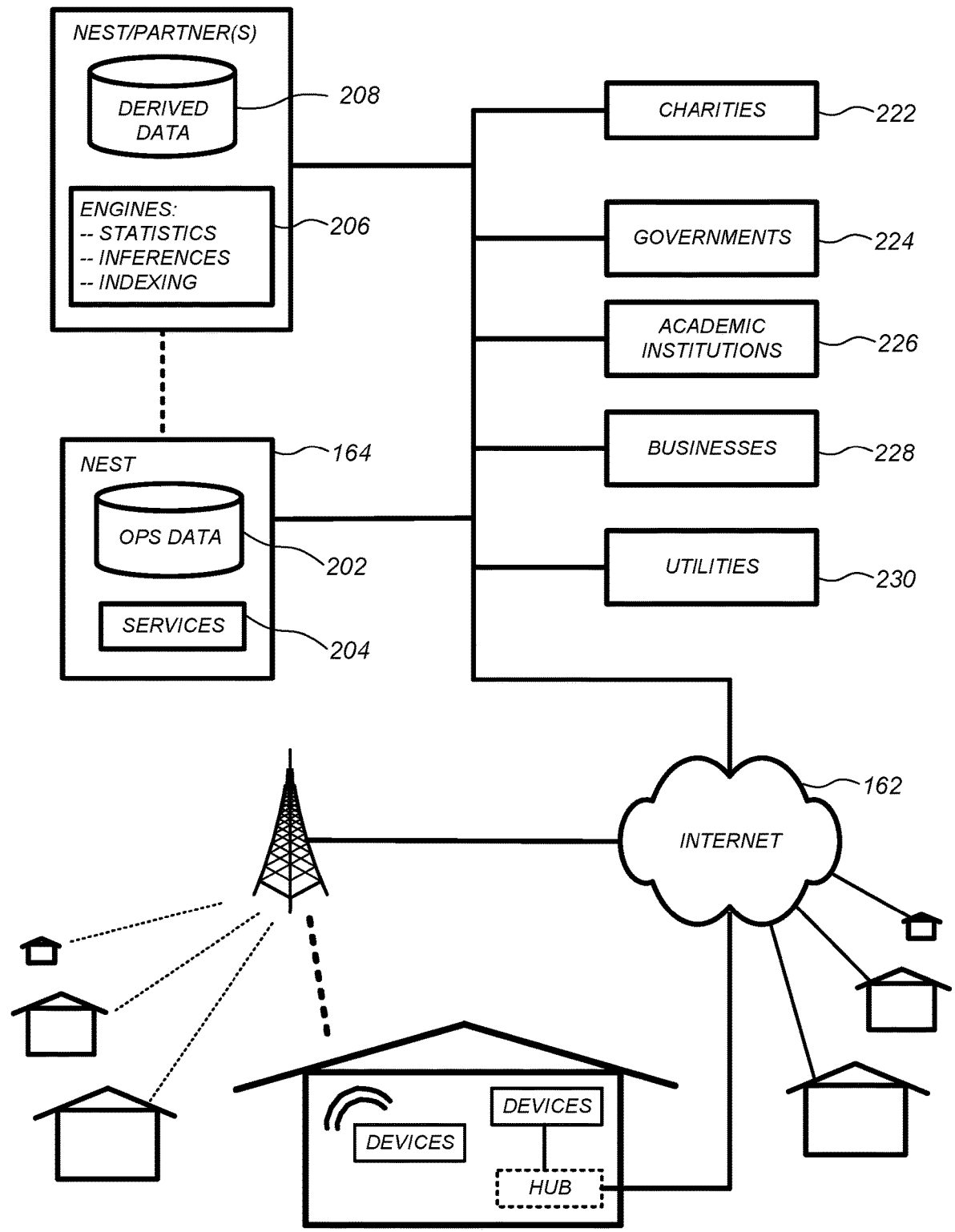
FIG. 2 illustrates a network-level view of an extensible devices and services platform with which the smart home of FIG. 1 can be integrated, according to some embodiments.

FIG. 2 illustrates a network-level view of an extensible devices and services platform with which the smart home of FIG. 1 can be integrated, according to some embodiments. Each of the intelligent, network-connected devices from FIG. 1 can communicate with one or more remote central servers or cloud computing systems 164. The communication can be enabled by establishing connection to the Internet 162 either directly (for example, using 3G/4G connectivity to a wireless carrier), though a hubbed network (which can be scheme ranging from a simple wireless router, for example, up to and including an intelligent, dedicated whole-home control node), or through any combination thereof.

The central server or cloud-computing system 164 can collect operation data 202 from the smart home devices. For example, the devices can routinely transmit operation data or can transmit operation data in specific instances (e.g., when requesting customer support). The central server or cloud-computing architecture 164 can further provide one or more services 204. The services 204 can include, e.g., software update, customer support, sensor data collection/logging, remote access, remote or distributed control, or use suggestions (e.g., based on collected operation data 204 to improve performance, reduce utility cost, etc.). Data associated with the services 204 can be stored at the central server or cloud-computing system 164 and the central server or cloud-computing system 164 can retrieve and transmit the data at an appropriate time (e.g., at regular intervals, upon receiving request from a user, etc.).

One salient feature of the described extensible devices and services platform, as illustrated in FIG. 2, is a processing engines 206, which can be concentrated at a single server or distributed among several different computing entities without limitation. Processing engines 206 can include engines configured to receive data from a set of devices (e.g., via the Internet or a hubbed network), to index the data, to analyze the data and/or to generate statistics based on the analysis or as part of the analysis. The analyzed data can be stored as derived data 208. Results of the analysis or statistics can thereafter be transmitted back to a device providing ops data used to derive the results, to other devices, to a server providing a webpage to a user of the device, or to other non-device entities. For example, use statistics, use statistics relative to use of other devices, use patterns, and/or statistics summarizing sensor readings can be transmitted. The results or statistics can be provided via the Internet 162. In this manner, processing engines 206 can be configured and programmed to derive a variety of useful information from the operational data obtained from the smart home. A single server can include one or more engines.

The derived data can be highly beneficial at a variety of different granularities for a variety of useful purposes, ranging from explicit programmed control of the devices on a per-home, per-neighborhood, or per-region basis (for example, demand-response programs for electrical utilities), to the generation of inferential abstractions that can assist on a per-home basis (for example, an inference can be drawn that the homeowner has left for vacation and so security detection equipment can be put on heightened sensitivity), to the generation of statistics and associated inferential abstractions that can be used for government or charitable purposes. For example, processing engines 206 can generate statistics about device usage across a population of devices and send the statistics to device users, service providers or other entities (e.g., that have requested or may have provided monetary compensation for the statistics). As specific illustrations, statistics can be transmitted to charities 222, governmental entities 224 (e.g., the Food and Drug Administration or the Environmental Protection Agency), academic institutions 226 (e.g., university researchers), businesses 228 (e.g., providing device warranties or service to related equipment), or utility companies 230. These entities can use the data to form programs to reduce energy usage, to preemptively service faulty equipment, to prepare for high service demands, to track past service performance, etc., or to perform any of a variety of beneficial functions or tasks now known or hereinafter developed.

Figure 3:
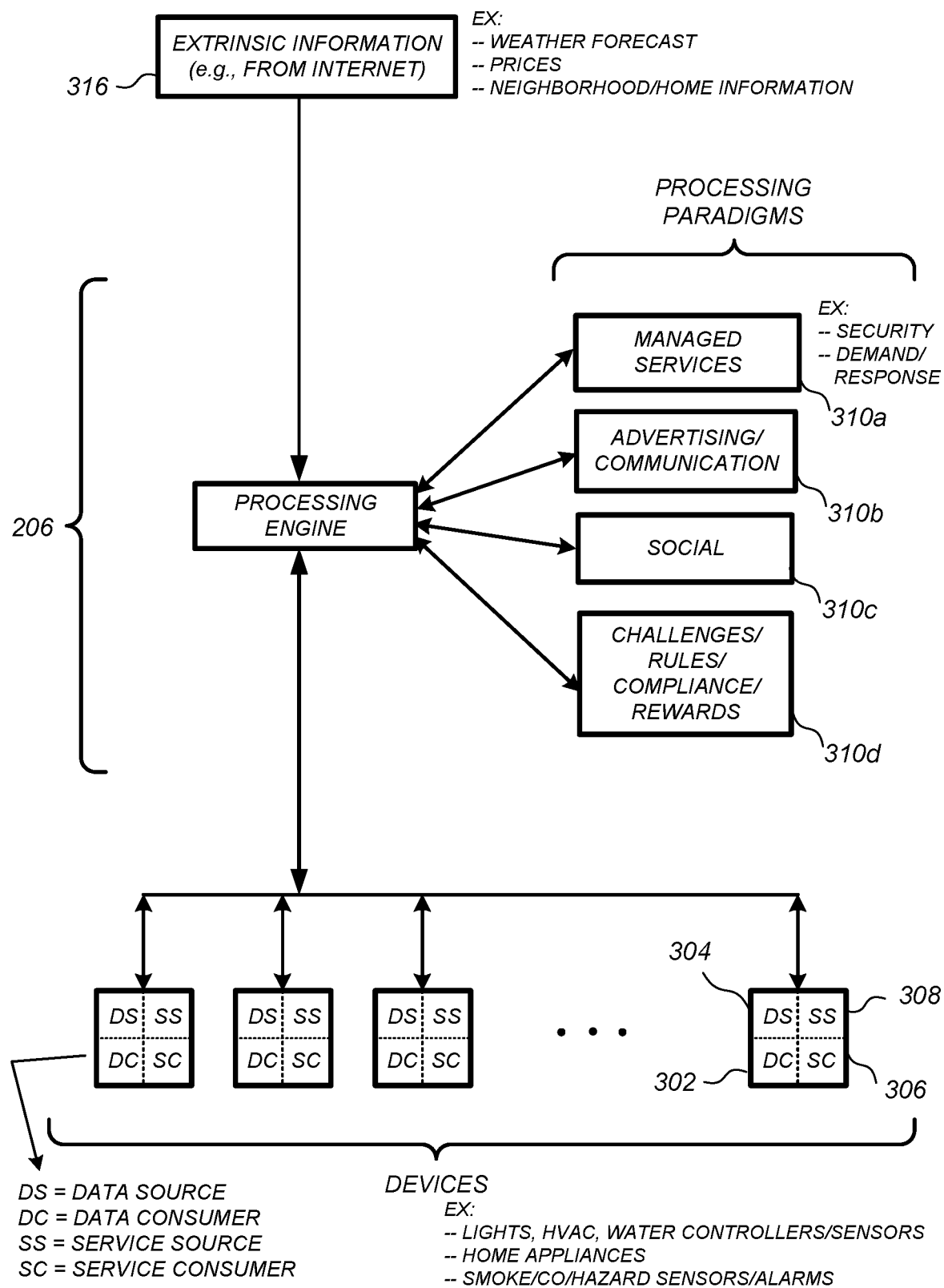
FIG. 3 illustrates an abstracted functional view of the extensible devices and services platform of FIG. 2, according to some embodiments.

FIG. 3 illustrates an abstracted functional view of the extensible devices and services platform of FIG. 2, with particular reference to the processing engine 206 as well as the devices of the smart home. Even though the devices situated in the smart home will have an endless variety of different individual capabilities and limitations, they can all be thought of as sharing common characteristics in that each of them is a data consumer 302 (DC), a data source 304 (DS), a services consumer 306 (SC), and a services source 308 (SS).

Advantageously, in addition to providing the essential control information needed for the devices to achieve their local and immediate objectives, the extensible devices and services platform can also be configured to harness the large amount of data that is flowing out of these devices. In addition to enhancing or optimizing the actual operation of the devices themselves with respect to their immediate functions, the extensible devices and services platform can also be directed to "repurposing" that data in a variety of automated, extensible, flexible, and/or scalable ways to achieve a variety of useful objectives. These objectives may be predefined or adaptively identified based on, e.g., usage patterns, device efficiency, and/or user input (e.g., requesting specific functionality).

For example, FIG. 3 shows processing engine 206 as including a number of paradigms 310. Processing engine 206 can include a managed services paradigm 310a that monitors and manages primary or secondary device functions. The device functions can include ensuring proper operation of a device given user inputs, estimating that (e.g., and responding to) an intruder is or is attempting to be in a dwelling, detecting a failure of equipment coupled to the device (e.g., a light bulb having burned out), implementing or otherwise responding to energy demand response events, or alerting a user of a current or predicted future event or characteristic. Processing engine 206 can further include an advertising/communication paradigm 310b that estimates characteristics (e.g., demographic information), desires and/or products of interest of a user based on device usage. Services, promotions, products or upgrades can then be offered or automatically provided to the user. Processing engine 206 can further include a social paradigm 310c that uses information from a social network, provides information to a social network (for example, based on device usage), processes data associated with user and/or device interactions with the social network platform. For example, a user's status as reported to their trusted contacts on the social network could be updated to indicate when they are home based on light detection, security system inactivation or device usage detectors. As another example, a user may be able to share device-usage statistics with other users. Processing engine 206 can include a challenges/rules/compliance/rewards paradigm 310d that informs a user of challenges, rules, compliance regulations and/or rewards and/or that uses operation data to determine whether a challenge has been met, a rule or regulation has been complied with and/or a reward has been earned. The challenges, rules or regulations can relate to efforts to conserve energy, to live safely (e.g., reducing exposure to toxins or carcinogens), to conserve money and/or equipment life, to improve health, etc.

Processing engine can integrate or otherwise utilize extrinsic information 316 from extrinsic sources to improve the functioning of one or more processing paradigms. Extrinsic information 316 can be used to interpret operational data received from a device, to determine a characteristic of the environment near the device (e.g., outside a structure that the device is enclosed in), to determine services or products available to the user, to identify a social network or social-network information, to determine contact information of entities (e.g., public-service entities such as an emergency-response team, the police or a hospital) near the device, etc., to identify statistical or environmental conditions, trends or other information associated with a home or neighborhood, and so forth.

An extraordinary range and variety of benefits can be brought about by, and fit within the scope of, the described extensible devices and services platform, ranging from the ordinary to the profound. Thus, in one "ordinary" example, each bedroom of the smart home can be provided with a smoke/fire/CO alarm that includes an occupancy sensor, wherein the occupancy sensor is also capable of inferring (e.g., by virtue of motion detection, facial recognition, audible sound patterns, etc.) whether the occupant is asleep or awake. If a serious fire event is sensed, the remote security/monitoring service or fire department is advised of how many occupants there are in each bedroom, and whether those occupants are still asleep (or immobile) or whether they have properly evacuated the bedroom. While this is, of course, a very advantageous capability accommodated by the described extensible devices and services platform, there can be substantially more "profound" examples that can truly illustrate the potential of a larger "intelligence" that can be made available. By way of perhaps a more "profound" example, the same data bedroom occupancy data that is being used for fire safety can also be "repurposed" by the processing engine 206 in the context of a social paradigm of neighborhood child development and education. Thus, for example, the same bedroom occupancy and motion data discussed in the "ordinary" example can be collected and made available for processing (properly anonymized) in which the sleep patterns of schoolchildren in a particular ZIP code can be identified and tracked. Localized variations in the sleeping patterns of the schoolchildren may be identified and correlated, for example, to different nutrition programs in local schools.

Figure 4:
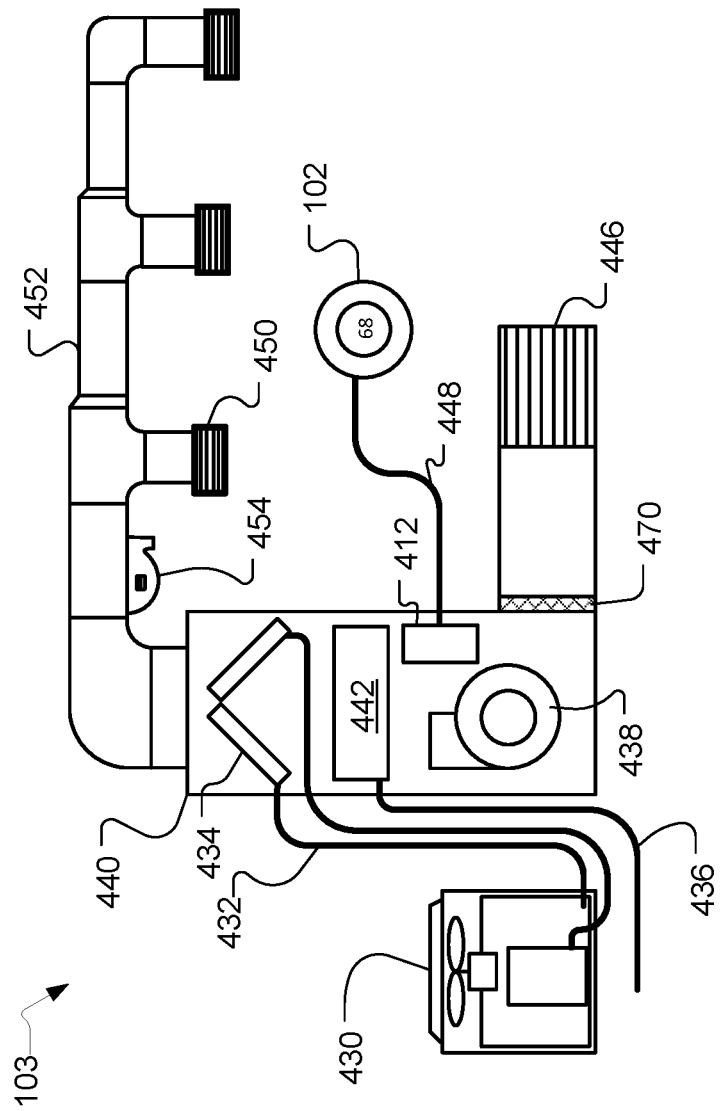
FIG. 4 illustrates a schematic diagram of an HVAC system, according to some embodiments.

FIG. 4 is a schematic diagram of an HVAC system, according to some embodiments. HVAC system 103 provides heating, cooling, ventilation, and/or air handling for an enclosure, such as structure 150 depicted in FIG. 1. System 103 depicts a forced air type heating and cooling system, although according to other embodiments, other types of HVAC systems could be used such as radiant heat based systems, heat-pump based systems, and others.

For carrying out the heating function, heating coils or elements 442 within air handler 440 provide a source of heat using electricity or gas via line 436. Cool air is drawn from the enclosure via return air duct 446 through filter 470, using fan 438 and is heated through the heating coils or elements 442. The heated air flows back into the enclosure at one or more locations via supply air duct system 452 and supply air registers such as register 450. In cooling, an outside compressor 430 passes a refrigerant gas through a set of heat exchanger coils and then through an expansion valve. The gas then goes through line 432 to the cooling coils or evaporator coils 434 in the air handler 440 where it expands, cools and cools the air being circulated via fan 438. A humidifier 454 may optionally be included in various embodiments that returns moisture to the air before it passes through duct system 452. Although not shown in FIG. 4, alternate embodiments of HVAC system 103 may have other functionality such as venting air to and from the outside, one or more dampers to control airflow within the duct system 452 and an emergency heating unit. Overall operation of HVAC system 103 is selectively actuated by control electronics 412 communicating with thermostat 102 over control wires 448.

The Smart-Home Thermostat

Figure 5:
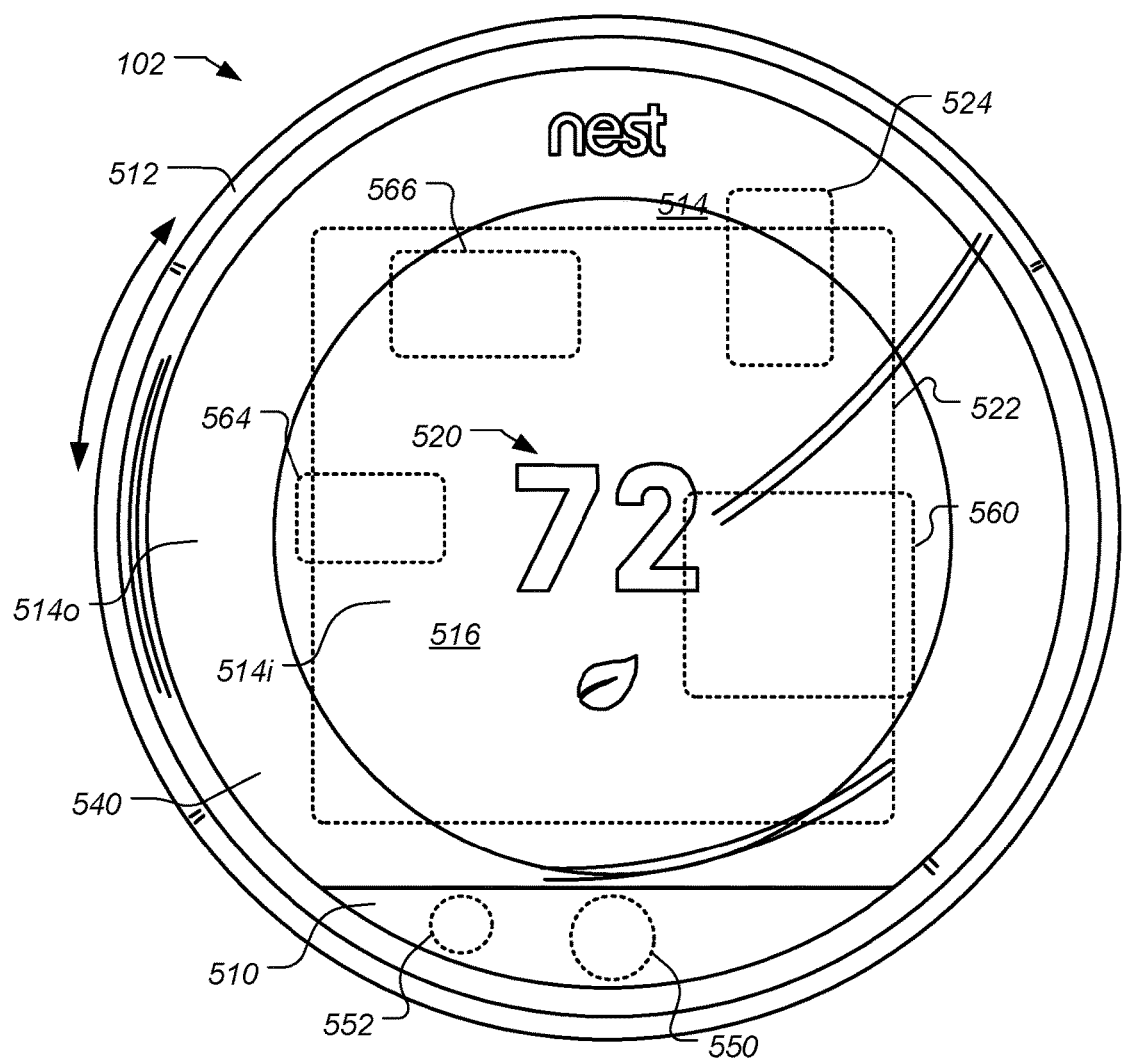
FIG. 5 illustrates a front view of a thermostat having a rounded exterior appearance including one or more sensors for detecting occupancy and/or users, according to some embodiments.
Figure 6:
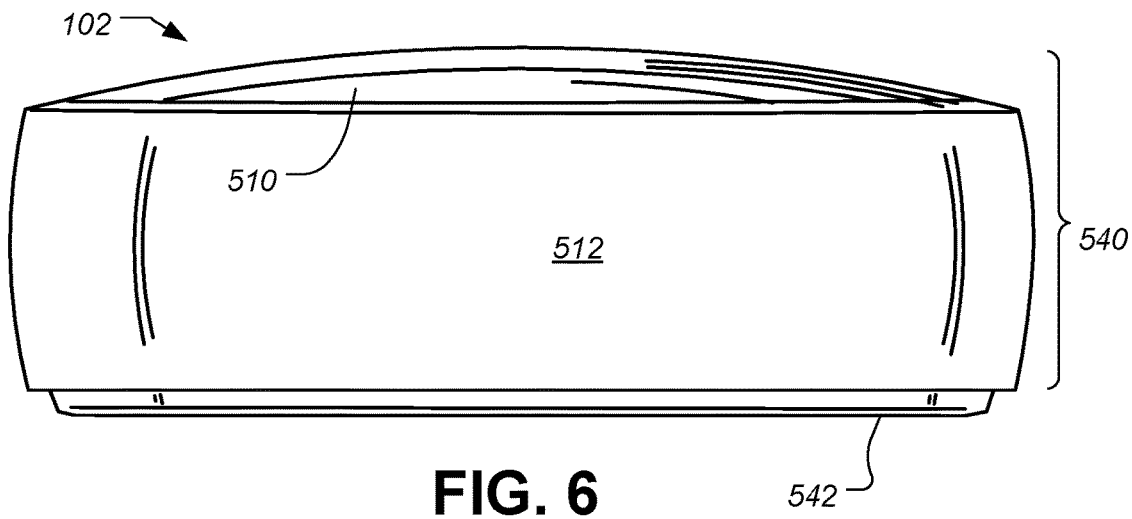
FIG. 6 illustrates a side view of a thermostat having a rounded exterior appearance including one or more sensors for detecting occupancy and/or users, according to some embodiments.

FIG. 5 illustrates a front view of a thermostat having a rounded exterior appearance and including one or more sensors for detecting environmental conditions, such as occupancy and/or users, temperature, ambient light, humidity, and so forth. FIG. 6 illustrates a bottom elevation view of the same thermostat 102. Unlike many prior art thermostats, thermostat 102 has a simple and elegant design. Moreover, user interaction with thermostat 102 is facilitated and greatly enhanced over known conventional thermostats. The thermostat 102 includes control circuitry and is electrically connected to an HVAC system 103, such as is shown in FIGS. 1-4. Thermostat 102 is wall mountable, is circular in shape, and has an outer rotatable ring 512 for receiving user input. Thermostat 102 has a large convex rounded front face lying inside the outer rotatable ring 512. According to some embodiments, thermostat 102 is approximately 84 mm in diameter and protrudes from the wall, when wall mounted, by 30 mm. The outer rotatable ring 512 allows the user to make adjustments, such as selecting a new setpoint temperature. For example, by rotating the outer ring 512 clockwise, the real-time (i.e. currently active) setpoint temperature can be increased, and by rotating the outer ring 512 counter-clockwise, the real-time setpoint temperature can be decreased.

The front face of the thermostat 102 comprises a cover 514 that according to some embodiments is polycarbonate, and a lens 510 having an outer shape that matches the contours of the curved outer front face of the thermostat 102. According to some embodiments, Fresnel lens elements may be formed on the interior surface of the lens 510 such that they are not obviously visible by viewing the exterior of the thermostat 102. Behind the lens 510 is a passive infrared (PIR) sensor 550 for detecting occupancy, a temperature sensor that is thermally coupled to the lens 510, and a multi-channel thermopile for detecting occupancy, user approaches, and motion signatures. The Fresnel lens elements of the lens 510 are made from a high-density polyethylene (HDPE) that has an infrared transmission range appropriate for sensitivity to human bodies. The lens 510 may also include thin sections that allow a near-field proximity sensor 552, such as a multi-channel thermopile, and a temperature sensor to "see-through" the lens 510 with minimal interference from the polyethylene. As shown in FIGS. 5-6, the front edge of the outer rotatable ring 512, cover 514, and lens 510 are shaped such that they together form an integrated convex rounded front face that has a common outward arc or spherical shape arcing outward.

Although being formed from a single lens-like piece of material such as polycarbonate, the cover 514 has two different regions or portions including an outer portion 514o and a central portion 514i. According to some embodiments, the cover 514 is darkened around the outer portion 514o, but leaves the central portion 514i visibly clear so as to facilitate viewing of an electronic display 516 disposed underneath. According to some embodiments, the cover 514 acts as a lens that tends to magnify the information being displayed in electronic display 516 to users. According to some embodiments the central electronic display 516 is a dot-matrix layout (i.e. individually addressable) such that arbitrary shapes can be generated. According to some embodiments, electronic display 516 is a backlit, color liquid crystal display (LCD). An example of information displayed on the electronic display 516 is illustrated in FIG. 5, and includes central numerals 520 that are representative of a current setpoint temperature. The thermostat 102 may be constructed such that the electronic display 516 is at a fixed orientation and does not rotate with the outer rotatable ring 512. For some embodiments, the cover 514 and lens 510 also remain at a fixed orientation and do not rotate with the outer ring 512. In alternative embodiments, the cover 514 and/or the lens 510 can rotate with the outer rotatable ring 512. According to one embodiment in which the diameter of the thermostat 102 is about 84 mm, the diameter of the electronic display 516 is about 54 mm. According to some embodiments the curved shape of the front surface of thermostat 102, which is made up of the cover 514, the lens 510 and the front facing portion of the ring 512, is spherical, and matches a sphere having a radius of between 100 mm and 180 mm. According to some embodiments, the radius of the spherical shape of the thermostat front is about 156 mm.

Motion sensing with PIR sensor 550 as well as other techniques can be used in the detection and/or prediction of occupancy. According to some embodiments, occupancy information is used in generating an effective and efficient scheduled program. A second near-field proximity sensor 552 is also provided to detect an approaching user. The near-field proximity sensor 552 can be used to detect proximity in the range of up to 10-15 feet. The PIR sensor 550 and/or the near-field proximity sensor 552 can detect user presence such that the thermostat 102 can initiate "waking up" and/or providing adaptive screen displays that are based on user motion/position when the user is approaching the thermostat and prior to the user touching the thermostat.

Such use of proximity sensing is useful for enhancing the user experience by being "ready" for interaction as soon as, or very soon after the user is ready to interact with the thermostat. Further, the wake-up-on-proximity functionality also allows for energy savings within the thermostat by "sleeping" when no user interaction is taking place or about to take place.

According to some embodiments, the thermostat 102 may be controlled by at least two types of user input, the first being a rotation of the outer rotatable ring 512 as shown in FIG. 5, and the second being an inward push on head unit 540 until an audible and/or tactile "click" occurs. For such embodiments, the head unit 540 is an assembly that includes the outer ring 512, the cover 514, the electronic display 516, and the lens 510. When pressed inwardly by the user, the head unit 540 travels inwardly by a small amount, such as 0.5 mm, against an interior switch (not shown), and then springably travels back out when the inward pressure is released, providing a tactile "click" along with a corresponding audible clicking sound. Thus, for the embodiment of FIGS. 5-6, an inward click can be achieved by direct pressing on the outer rotatable ring 512 itself, or by indirect pressing of the outer rotatable ring 512 by virtue of providing inward pressure on the cover 514, the lens 510, or by various combinations thereof. For other embodiments, the thermostat 102 can be mechanically configured such that only the outer ring 512 travels inwardly for the inward click input, while the cover 514 and lens 510 remain motionless.

FIG. 6 illustrates a right side elevation view of the thermostat 102. According to some embodiments, the thermostat 102 includes a processing system 560, display driver 564 and a wireless communications system 566. The processing system 560 is adapted to cause the display driver 564 and display 516 to display information to the user, and to receive user input via the outer rotatable ring 512. The processing system 560, according to some embodiments, is capable of carrying out the governance of the operation of thermostat 102 including various user interface features. The processing system 560 is further programmed and configured to carry out other operations, such as maintaining and updating a thermodynamic model for the enclosure in which the HVAC system is installed. According to some embodiments, a wireless communications system 566 is used to communicate with devices such as personal computers, other thermostats or HVAC system components, smart phones, local home wireless networks, routers, gateways, home appliances, security systems, hazard detectors, remote thermostat management servers, distributed sensors and/or sensor systems, and other components it the modern smart-home environment. Such communications may include peer-to-peer communications, communications through one or more servers located on a private network, or and/or communications through a cloud-based service.

According to some embodiments, the thermostat 102 includes a head unit 540 and a backplate (or wall dock) 542. Head unit 540 of thermostat 102 is slidably mountable onto back plate 542 and slidably detachable therefrom. According to some embodiments the connection of the head unit 540 to backplate 542 can be accomplished using magnets, bayonet, latches and catches, tabs, and/or ribs with matching indentations, or simply friction on mating portions of the head unit 540 and backplate 542. Also shown in FIG. 5A is a rechargeable battery 522 that is recharged using recharging circuitry 524 that uses power from backplate that is either obtained via power harvesting (also referred to as power stealing and/or power sharing) from the HVAC system control circuit(s) or from a common wire, if available. According to some embodiments, the rechargeable battery 522 may include a single cell lithium-ion battery, or a lithium-polymer battery.

Figure 7:
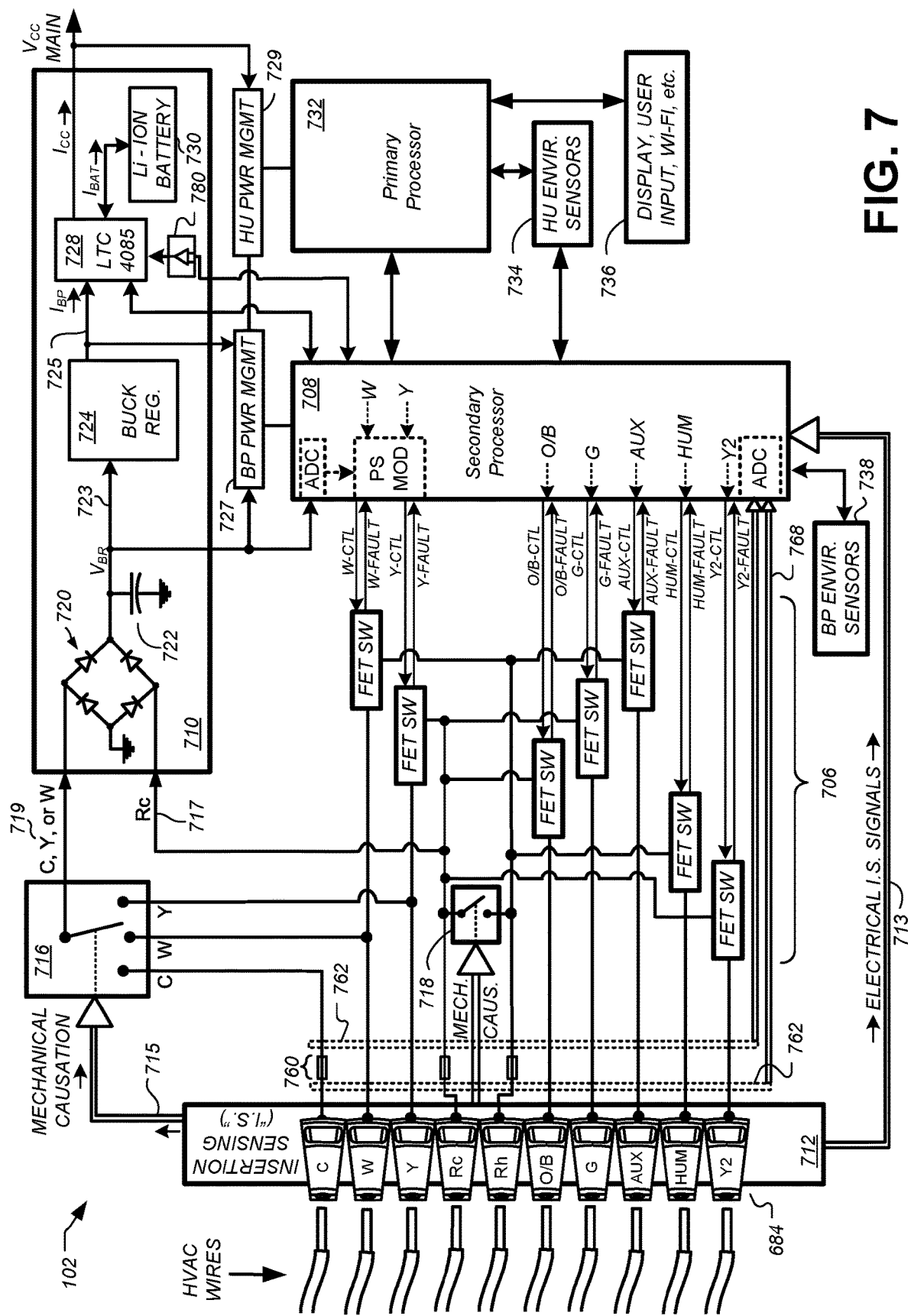
FIG. 7 illustrates a block diagram illustrating circuitry within a thermostat, according to some embodiments.

FIG. 7 illustrates a power management and power harvesting system for a smart thermostat, according to some embodiments. FIG. 7 shows connections to common HVAC wiring, such as a W (heat call relay wire); Y (cooling call relay wire); Y2 (second stage cooling call relay wire); Rh (heat call relay power); Rc (cooling call relay power); G (fan call relay wire); O/B (heat pump call relay wire); AUX (auxiliary call relay wire); HUM (humidifier call relay wire); and C (common wire). The thermostat 102 comprises a plurality of FET switches 706 used for carrying out the essential thermostat operations of connecting or "shorting" one or more selected pairs of HVAC wires together according to the desired HVAC operation. The operation of each of the FET switches 706 is controlled by a secondary processor 708 which can comprise, for example, an STM32L 32-bit ultra-low power ARM-based microprocessor available from ST Microelectronics.

Thermostat 102 further comprises powering circuitry 710 that comprises components contained on both the backplate 542 and head unit 540. Generally speaking, it is the purpose of powering circuitry 710 to extract electrical operating power from the HVAC wires and convert that power into a usable form for the many electrically-driven components of the thermostat 102. Thermostat 102 further comprises insertion sensing components 712 configured to provide automated mechanical and electrical sensing regarding the HVAC wires that are inserted into the thermostat 102. Thermostat 102 further comprises a relatively high-power primary processor 732, such as an AM3703 Sitara ARM microprocessor available from Texas Instruments, the i.MX 6SoloX ARM microprocessor available from NXP, and/or the i.MX 6UltraLite also available from NXP, that provides the main general governance of the operation of the thermostat 102. Thermostat 102 further comprises environmental sensors 734/738 (e.g., temperature sensors, humidity sensors, active IR motion sensors, passive IR motion sensors, multi-channel thermopiles, ambient visible light sensors, accelerometers, ambient sound sensors, ultrasonic/infrasonic sound sensors, microwave sensors, GPS sensors, etc.), as well as other components 736 (e.g., electronic display devices and circuitry, user interface devices and circuitry, wired communications circuitry, wireless communications circuitry, etc.) that are operatively coupled to the primary processor 732 and/or secondary processor 708 and collectively configured to provide the functionalities described in the instant disclosure.

The insertion sensing components 712 include a plurality of HVAC wiring connectors 684, each containing an internal springable mechanical assembly that, responsive to the mechanical insertion of a physical wire thereinto, will mechanically cause an opening or closing of one or more dedicated electrical switches associated therewith. With respect to the HVAC wiring connectors 684 that are dedicated to the C, W, Y, Rc, and Rh terminals, those dedicated electrical switches are, in turn, networked together in a manner that yields the results that are illustrated in FIG. 7 by the blocks 716 and 718. The output of block 716, which is provided at a node 719, is dictated solely by virtue of the particular combination of C, W, and Y connectors into which wires have been mechanically inserted in accordance with the following rules: if a wire is inserted into the C connector, then the node 719 becomes the C node regardless of whether there are any wires inserted into the Y or W connectors; if no wire is inserted into the C connector and a wire is inserted into the Y connector, then the node 719 becomes the Y node regardless of whether there is a wire inserted into the W connector; and if no wire is inserted into either of the C or Y connectors, then the node 719 becomes the W node. Block 718 is shown as being coupled to the internal sensing components 712 by virtue of double lines termed "mechanical causation," for the purpose of denoting its operation, which is either to short the Rc and Rh nodes together or not to short the Rc and Rh nodes together. Whether the block 718 will short, or not short, the Rc and Rh nodes together is dictated solely by virtue of the particular combination of Rc and Rh connectors into which wires have been mechanically inserted. Block 718 will keep the Rc and Rh nodes shorted together, unless wires have been inserted into both the Rc and Rh connectors, in which case the block 718 will not short the Rc and Rh nodes together because a two-HVAC-transformer system is present. For each of the respective wiring connectors 684, the insertion sensing circuitry 712 is also configured to provide at least two signals to the secondary processor 708, the first being a simple "open" or "short" signal that corresponds to the mechanical insertion of a wire, and the second being a voltage or other level signal that represents a sensed electrical signal at that terminal. The first and second electrical signals for each of the respective wiring terminals 684 can advantageously be used as a basis for basic "sanity checking" to help detect and avoid erroneous wiring conditions.

Basic operation of each of the FET switches 706 is achieved by virtue of a respective control signal (e.g., W-CTL, Y-CTL) provided by the secondary processor 708 that causes the corresponding FET switch 706 to "connect" or "short" its respective HVAC lead inputs for an ON control signal, and that causes the corresponding FET switch 706 to "disconnect" or "leave open" or "open up" its respective HVAC lead inputs for an "OFF" control signal. By virtue of the above-described operation of block 718, it is automatically the case that for single-transformer systems having only an "R" wire (rather than separate Rc and Rh wires as would be present for two-transformer systems), that "R" wire can be inserted into either of the Rc or Rh terminals, and the Rh-Rc nodes will be automatically shorted to form a single "R" node, as needed for proper operation. In contrast, for dual-transformer systems, the insertion of two separate wires into the respective Rc and Rh terminals will cause the Rh-Rc nodes to remain disconnected to maintain two separate Rc and Rh nodes, as needed for proper operation.

Referring now to the powering circuitry 710 in FIG. 7, provided is a configuration that automatically adapts to the powering situation presented to the thermostat 102 at the time of installation and thereafter. The powering circuitry 710 comprises a full-wave bridge rectifier 720, a storage and waveform-smoothing bridge output capacitor 722 (which can be, for example, on the order of 30 microfarads), a buck regulator circuit system 724, a power-and-battery (PAB) regulation circuit 728, and a rechargeable lithium-ion battery 730. In conjunction with other control circuitry including backplate power management circuitry 727, head unit power management circuitry 729, and the secondary processor 708, the powering circuitry 710 is configured and adapted to have the characteristics and functionality described hereinbelow.

By virtue of the configuration illustrated in FIG. 7, when there is a "C" wire presented upon installation, the powering circuitry 710 operates as a relatively high-powered, rechargeable-battery-assisted AC-to-DC converting power supply. When there is not a "C" wire presented, the powering circuitry 710 operates as a power-stealing, rechargeable-battery-assisted AC-to-DC converting power supply. As illustrated in FIG. 7, the powering circuitry 710 generally serves to provide the voltage Vcc MAIN that is used by the various electrical components of the thermostat 102, and that in one embodiment will usually be about 3.7V~3.95V. The general purpose of powering circuitry 710 is to convert the 24 VAC presented between the input leads 719 and 717 to a steady DC voltage output at the Vcc MAIN node to supply the thermostat electrical power load.

Operation of the powering circuitry 710 for the case in which the "C" wire is present is now described. When the 24 VAC input voltage between nodes 719 and 717 is rectified by the full-wave bridge rectifier 720, a DC voltage at node 723 is present across the bridge output capacitor 722, and this DC voltage is converted by the buck regulator system 724 to a relatively steady voltage, such as 4.4 volts, at node 725, which provides an input current IBP to the power-and-battery (PAB) regulation circuit 728.

The secondary processor 708 controls the operation of the powering circuitry 710 at least by virtue of control leads leading between the secondary processor 708 and the PAB regulation circuit 728, which for one embodiment can include an LTC4085-4 chip available from Linear Technologies Corporation. The LTC4085-4 is a USB power manager and Li-Ion/Polymer battery charger originally designed for portable battery-powered applications. The PAB regulation circuit 728 provides the ability for the secondary processor 708 to specify a maximum value $I_{BP}(max)$ for the input current $I_{BP}$. The PAB regulation circuit 728 is configured to keep the input current at or below $I_{BP}(max)$, while also providing a steady output voltage Vcc, such as 4.0 volts, while also providing an output current Icc that is sufficient to satisfy the thermostat electrical power load, while also tending to the charging of the rechargeable battery 730 as needed when excess power is available, and while also tending to the proper discharging of the rechargeable battery 730 as needed when additional power (beyond what can be provided at the maximum input current $I_{BP}(max)$) is needed to satisfy the thermostat electrical power load.

Operation of the powering circuitry 710 for the case in which the "C" wire is not present is now described. As used herein, "inactive power stealing" refers to the power stealing that is performed during periods in which there is no active call in place based on the lead from which power is being stolen. As used herein, "active power stealing" refers to the power stealing that is performed during periods in which there is an active call in place based on the lead from which power is being stolen.

During inactive power stealing, power is stolen from between, for example, the "Y" wire that appears at node 719 and the Rc lead that appears at node 717. There will be a 24 VAC HVAC transformer voltage present across nodes 719/717 when no cooling call is in place (i.e., when the Y-Rc FET switch is open). For one embodiment, the maximum current $I_{BP}(max)$ is set to a relatively modest value, such as 20 mA, for the case of inactive power stealing. Assuming a voltage of about 4.4 volts at node 725, this corresponds to a maximum output power from the buck regulator system 724 of about 88 mW. This power level of 88 mW has been found to not accidentally trip the HVAC system into an "on" state due to the current following through the call relay coil. During this time period, the PAB regulator 728 operates to discharge the battery 730 during any periods of operation in which the instantaneous thermostat electrical power load rises above 88 mW, and to recharge the battery (if needed) when the instantaneous thermostat electrical power load drops below 88 mW. The thermostat 700 is configured such that the average power consumption is well below 88 mW, and indeed for some embodiments is even below 10 mW on a long-term time average.

Operation of the powering circuitry 710 for "active power stealing" is now described. During an active heating/cooling call, it is necessary for current to be flowing through the HVAC call relay coil sufficient to maintain the HVAC call relay in a "tripped" or ON state at all times during the active heating/cooling call. The secondary processor 708 is configured by virtue of circuitry denoted "PS MOD" to turn, for example, the Y-Rc FET switch OFF for small periods of time during the active cooling call, wherein the periods of time are small enough such that the cooling call relay does not "un-trip" into an OFF state, but wherein the periods of time are long enough to allow inrush of current into the bridge rectifier 720 to keep the bridge output capacitor 722 to a reasonably acceptable operating level. For one embodiment, this is achieved in a closed-loop fashion in which the secondary processor 708 monitors the voltage VBR at node 723 and actuates the signal Y-CTL as necessary to keep the bridge output capacitor 722 charged. According to one embodiment, it has been found advantageous to introduce a delay period, such as 60-90 seconds, following the instantiation of an active heating/cooling cycle before instantiating the active power stealing process. This delay period has been found useful in allowing many real-world HVAC systems to reach a kind of "quiescent" operating state in which they will be much less likely to accidentally un-trip away from the active cooling cycle due to active power stealing operation of the thermostat 102. According to another embodiment, it has been found further advantageous to introduce another delay period, such as 60-90 seconds, following the termination of an active cooling cycle before instantiating the inactive power stealing process. This delay period has likewise been found useful in allowing the various HVAC systems to reach a quiescent state in which accidental tripping back into an active cooling cycle is avoided.

Power Management Integrated Circuit

In FIG. 7 above, the powering circuitry 710 is primarily configured to perform a number of different functions. For example, the powering circuitry 710 is configured to receive power from the HVAC system, either through a C wire or through power stealing from another HVAC wire, and convert that power to a steady DC voltage using the full-wave bridge rectifier 720, the waveform-smoothing bridge output capacitor 722, and the buck regulator circuit system 724. The power-and-battery (PAB) regulation circuit 728 is configured to accept the DC voltage from the buck regulator circuit system 724 and provide a $V_{cc}$ Main output voltage to charge the rechargeable lithium-ion battery 730 or other energy-storage component. The backplate power management circuitry 727, the head unit power management circuitry 729, and a feedback circuit 780 may be comprised of discrete, individual components on the thermostat circuit board. In conjunction with the secondary processor 708, the powering circuitry 710 regulates the opening/closing of the FET switches 706 during power stealing intervals such that the normal operation of the HVAC system is not disturbed.

One possible disadvantage of using individual components as laid out in FIG. 7 is the stacking of tolerances. Because each component is likely manufactured by different suppliers, the tolerances of each component may vary within the manufacturing specifications of the supplier. While the tolerances of individual components (e.g., resistors, capacitors, diodes, etc.) may be small, when these tolerances are stacked together in an integrated circuit board like that of the smart-home thermostat, the overall tolerance of the system may vary greatly. This can affect the efficiency with which power is harvested from the HVAC system, and can affect the reliability of the powering circuitry 710, even when all of the components are all manufactured by the same provider. Additionally, building the powering circuitry 710 from individual, discrete components can be costly both in terms of assembly time and component cost. Using discrete components on the circuit board also leads to quiescent current inefficiencies as many basic functions are duplicated, such as power-on-reset, analog references, digital control blocks, and so forth.

Figure 8:
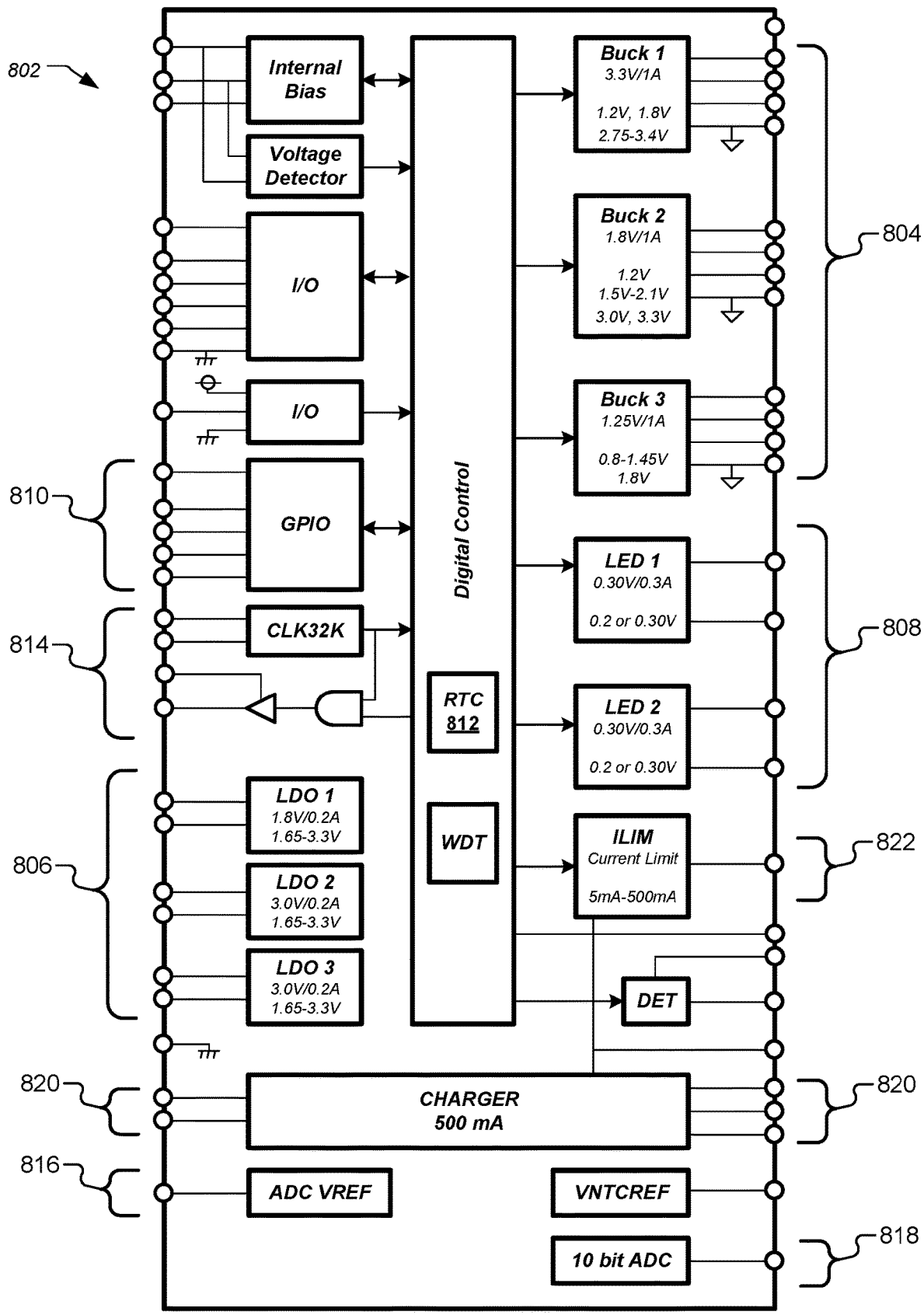
FIG. 8 illustrates a custom power management integrated circuit (PMIC).

To address these and many other issues, FIG. 8 illustrates a custom power management integrated circuit (PMIC) 802 that has been designed specifically to increase the efficiency and reliability of the powering circuitry 710 for the smart-home thermostat. In some embodiments, the PMIC comprises a low-power single-chip power management IC that can be used in any battery-powered portable device. The PMIC 802 includes three low-current consumption buck converters 804 and three low drop-out regulators (LDOs) 806 that can provide outputs of various voltages/currents as illustrated in FIG. 8. The PMIC 802 also includes a pair of light-emitting diode (LED) drivers 808, a number of general purpose input/outputs (GPIOs) 810, a real-time clock (RTC) 812, a 32 kHz crystal oscillator 814, a high-accuracy voltage reference VREF 816 for use with an external analog-to-digital controller (ADC), a 10-bit successive approximation register (SAR) ADC 818 that can be used with a battery temperature monitor, a battery charger 820 with scalable charge currents, a digitally programmable current limit 822, an I$^2$C communication interface, and a number of other systems that provide the functionality needed to replace much of the powering circuitry 710 from FIG. 7.

The unique combination of functions in the PMIC 802 offers a single solution for many of the power management functions required by a smart-home thermostat or other smart-home devices. By packaging these functions into a single integrated circuit, the overall cost of the power management system can be reduced. Additionally, because the tolerances can be tightly controlled throughout the integrated circuit manufacturing process, the PMIC 802 is not necessarily susceptible to the same types of tolerance stacking issues that would otherwise accompany isolated, discrete components on a circuit board of a smart-home device. Integrating various circuit functions into a single IC as described in the embodiments herein can reduce quiescent current by sharing central functions (e.g., power-on-reset, analog references, digital control blocks, etc.).

Figure 9:
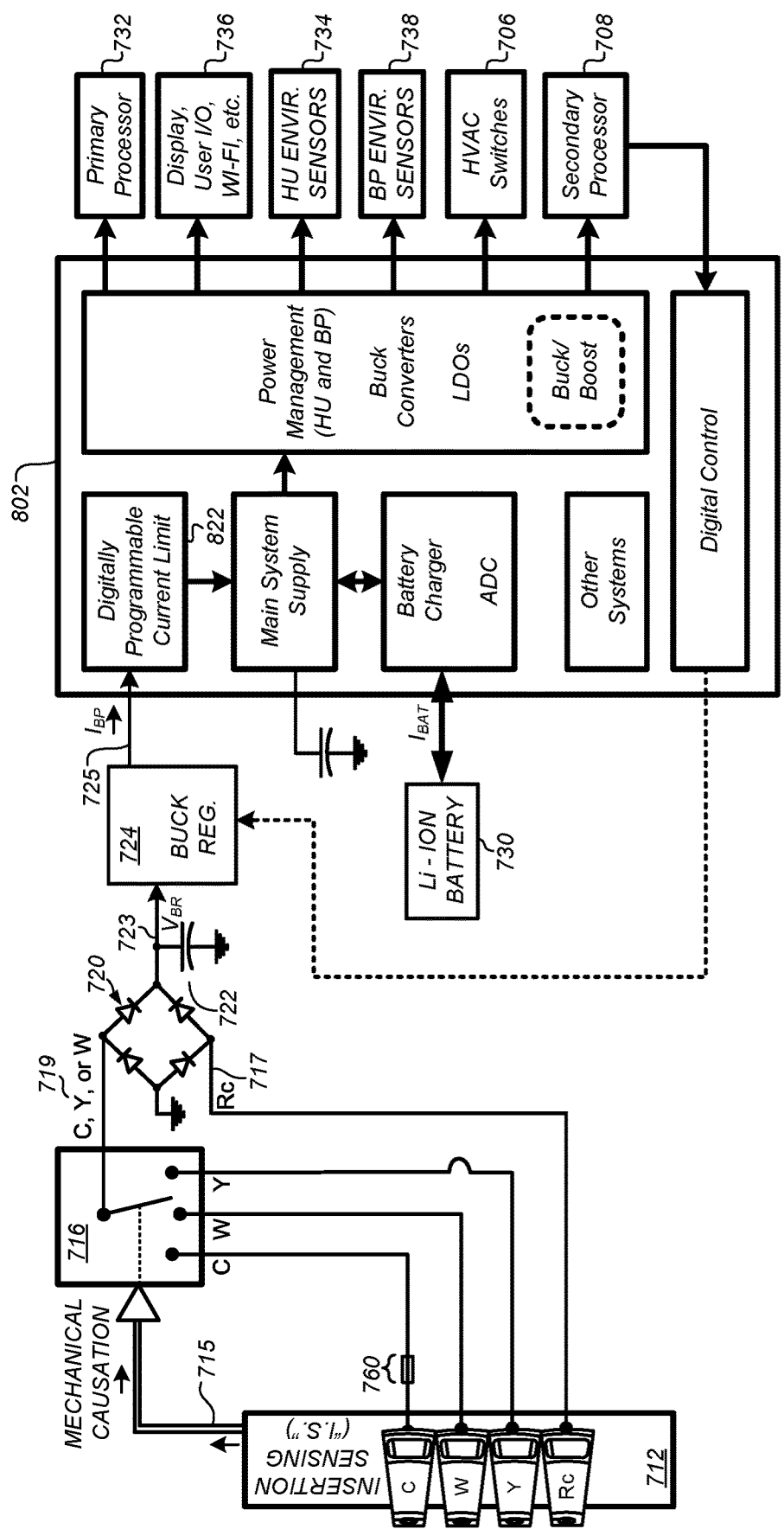
FIG. 9 illustrates a simplified block diagram of a smart-home thermostat using the PMIC of FIG. 8.

To illustrate how the PMIC 802 can be used to replace some of the powering circuitry 710 from FIG. 7, FIG. 9 illustrates a simplified block diagram of a smart-home thermostat using the PMIC 802. For reasons of clarity, some of the systems 804-822 of the PMIC 802 in FIG. 8 have been combined into single blocks in FIG. 9. Additionally, some of these systems, HVAC connections, and other circuitry from FIG. 7 have been omitted for clarity. First, the buck regulator circuit system 724 continues to provide a steady voltage (e.g., 4.4 V) at node 725. The current IBP may be received by the digitally programmable current limit 822 of the PMIC 802. As described above in relation to FIG. 7, the digitally programmable current limit 822 can replace the function of the PAB regulation circuit 728 to limit the amount of current drawn from the HVAC system. The current IBP may be used internally by the PMIC 802 to power the battery charger 820 to charge the rechargeable battery 730. The current IBP may also provide power to a main system supply that replaces the backplate power management circuitry 727 and head unit power management circuitry 729 that previously provided voltage rails to the internal systems of the smart-home thermostat. For example, power rails can be provided by the PMIC 802 buck converters and LDOs to the primary processor 732, the user interface and radios 736, the head unit environmental sensors 734, the backplate environmental sensors 738, the HVAC switches 706, and/or the secondary processor 708.

The PMIC 802 can communicate with the secondary processor 708 via a communication bus, such as an I$^2$C bus. This allows the secondary processor 708 to adjust the operation of the PMIC 802 dynamically during the operation of the smart-home thermostat. For example, the secondary processor 708 can cause the PMIC 802 to change the digitally programmable current limit 822 during operation. In some embodiments, a link between the digital control of the PMIC 802 and the buck regulator circuit system 724 can be established, such that the secondary processor 708 can cause the PMIC 802 to change the voltage/current that is provided to the PMIC 802 from the buck regulator circuit system 724. For example, different HVAC systems may be able to provide more or less current before inadvertently tripping the HVAC call relay. The digital control of the PMIC 802 can be used to adjust the current provided by the buck regulator circuit system 724 in response to variations in HVAC system types. In some embodiments, the digital control of the PMIC 802 can also adjust the current provided during active versus inactive HVAC cycles. The digital control of the PMIC 802 can also change the output voltages of the buck converters for dynamic voltage and frequency scaling (DVFS) of the primary processor 732. Some embodiments may also allow the secondary processor 708 to enable/disable the LED drivers of the PMIC 802 over the communication bus.

Figure 10A:
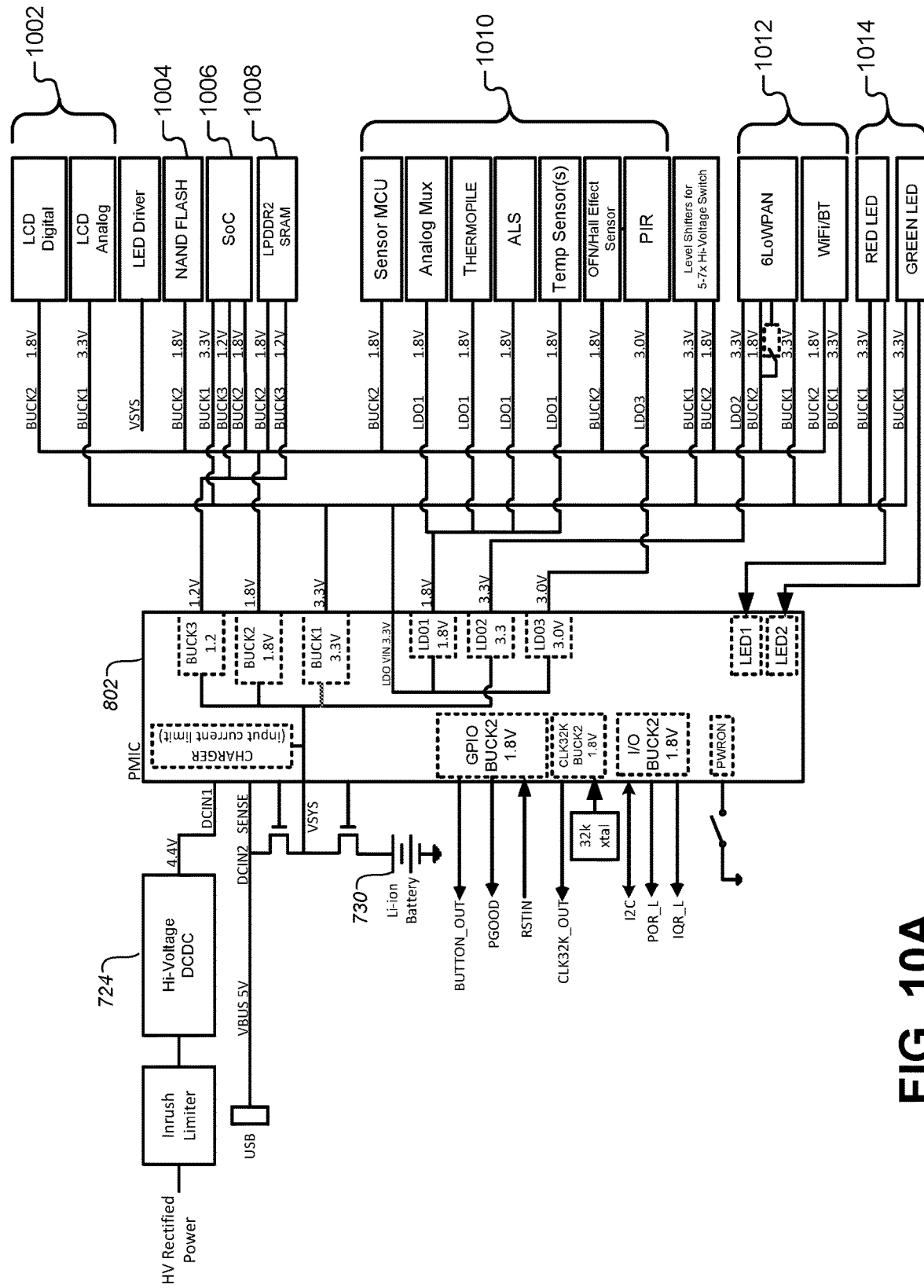
FIG. 10A illustrates one specific embodiment of a smart-home thermostat using the PMIC of FIG. 8 to manage the power and battery charging functions.

FIG. 10A illustrates one specific embodiment of a smart-home thermostat using the PMIC 802 to manage the power and battery charging functions. As described above, the buck regulator circuit system 724 can provide power to the battery charger, which in turn can charge the lithium-ion rechargeable battery 730. The buck converters 804 can be set to 1.2 V, 1.8 V, and 3.3 V. Similarly, the LDOs 806 can be set to 1.8 V, 3.0 V, and 3.3 V. These rails can be provided as shown in FIG. 10A to the various systems on the smart-home thermostat, including an LCD user interface driver 1002, a flash memory 1004, an SoC chip 1006, a memory 1008, various sensors 1010, level shifters for the high-voltage switches 1012, onboard radios 1012, and a number of LED indicators 1014. Additionally, some of the I/O pins can be dedicated as I$^2$C bus lines to communicate with the secondary processor 708.

It is to be understood that the circuit connections in FIG. 10 are specific to one embodiment of a smart-home thermostat. In other embodiments, different combinations of the voltages/currents provided by the buck converters 804 and the LDOs 806 may be used to power different systems, depending on the needs of the thermostat. While this particular embodiment is specific to a power-harvesting thermostat that limits the current received from the HVAC system and charges the rechargeable battery 730, other embodiments may eliminate the battery charging functionality.

Figure 10B:
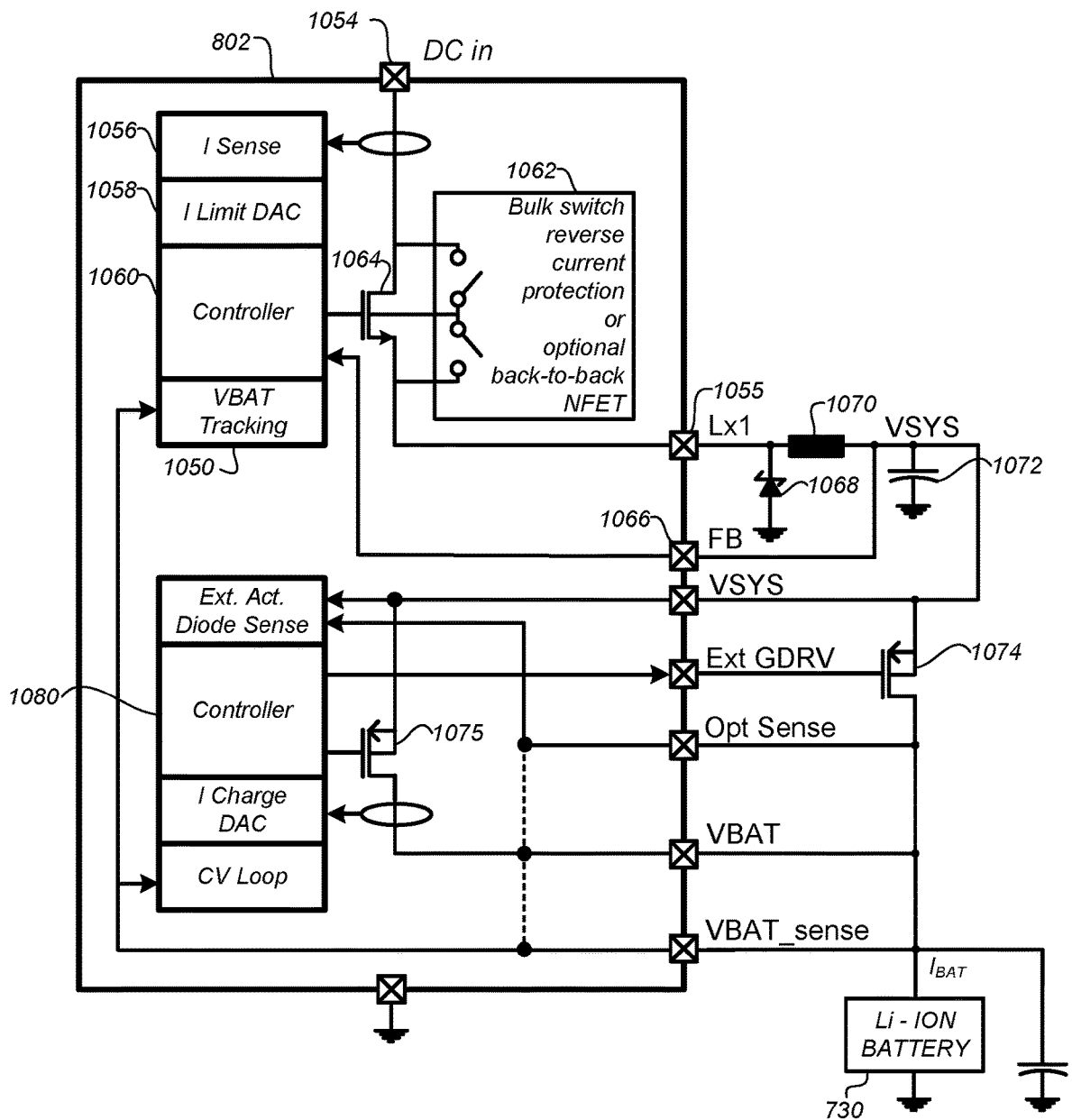
FIG. 10B illustrates an alternate embodiment of the PMIC of FIG. 8 with an internal current limit and buck converter circuit.

FIG. 10B illustrates an alternate embodiment of the PMIC 802 with an internal current limit and buck converter circuit. This circuit can replace some of the internal/external circuit elements of the PMIC 802 in FIG. 9 to more efficiently regulate the current drawn from the HVAC system, more efficiently charge the battery by tracking the voltage output with the battery voltage, and provide a reliable current limit before DC conversion/regulation takes place.

The DC current from either the full rectifier diode bridge 720 or from the buck regulator 724 can be received at the DC input pin 1054, and a current-limited output can be generated at Lx1 at pin 1055. In embodiments where the DC input is received from the full rectifier diode bridge 720, the buck regulator 724 can be eliminated from the circuit board design, and the DC input can be regulated and current-limited entirely by the top half of the circuit in FIG. 10B. The current sense circuit 1056 senses the amount of current being received from the DC input pin 1054. The current limit DAC 1058 stores a digital representation of a current limit programmed into the PMIC 802. This current limit replaces the current limit set by the LTC 4085 chip (728) in FIG. 7.

The controller 1060 can receive the output from the current sense 1056 and the output from the current limit DAC 1058 and use the difference between those two outputs to regulate the operation of the FET 1064 to thereby limit the current until the output of the current sense 1056 is approximately equal to the output of the current limit DAC 1058. In effect, this moves the current regulation from the output of the buck regulator 724 in FIG. 7 to the PMIC 802. Recall that one purpose of the current limit is to prevent the HVAC system from triggering during power stealing. By moving the current limit function in front of the DC regulation in the circuit, the current can be effectively limited before any DC conversion takes place, thus minimizing the chance that the DC conversion could cause the HVAC system to inadvertently trigger. Additionally, moving the current limit function to the input of the buck conversion stage reduces one step in the tolerance stack-up described above, and it allows for greater overall power transfer during buck conversion.

To limit the current, the controller 1060 can regulate the gate voltage applied to the FET 1064. Specifically, the controller 1016 can control the timing of voltages applied to the gate of the FET 1064 such that switching the FET 1064 on and off will operate like a buck converter. In some embodiments, the controller 1060 may be a pulse-width modulated (PWM) controller that regulates the pulse width based on the difference between the output of the current sense 1056 and the current limit DAC 1058. In some embodiments, the controller 1060 may be a pulse-frequency modulation (PFM) controller or a constant on-time (COT) controller. In some embodiments, the controller 1060 can regulate the average current based on this difference.

Figure 10C:
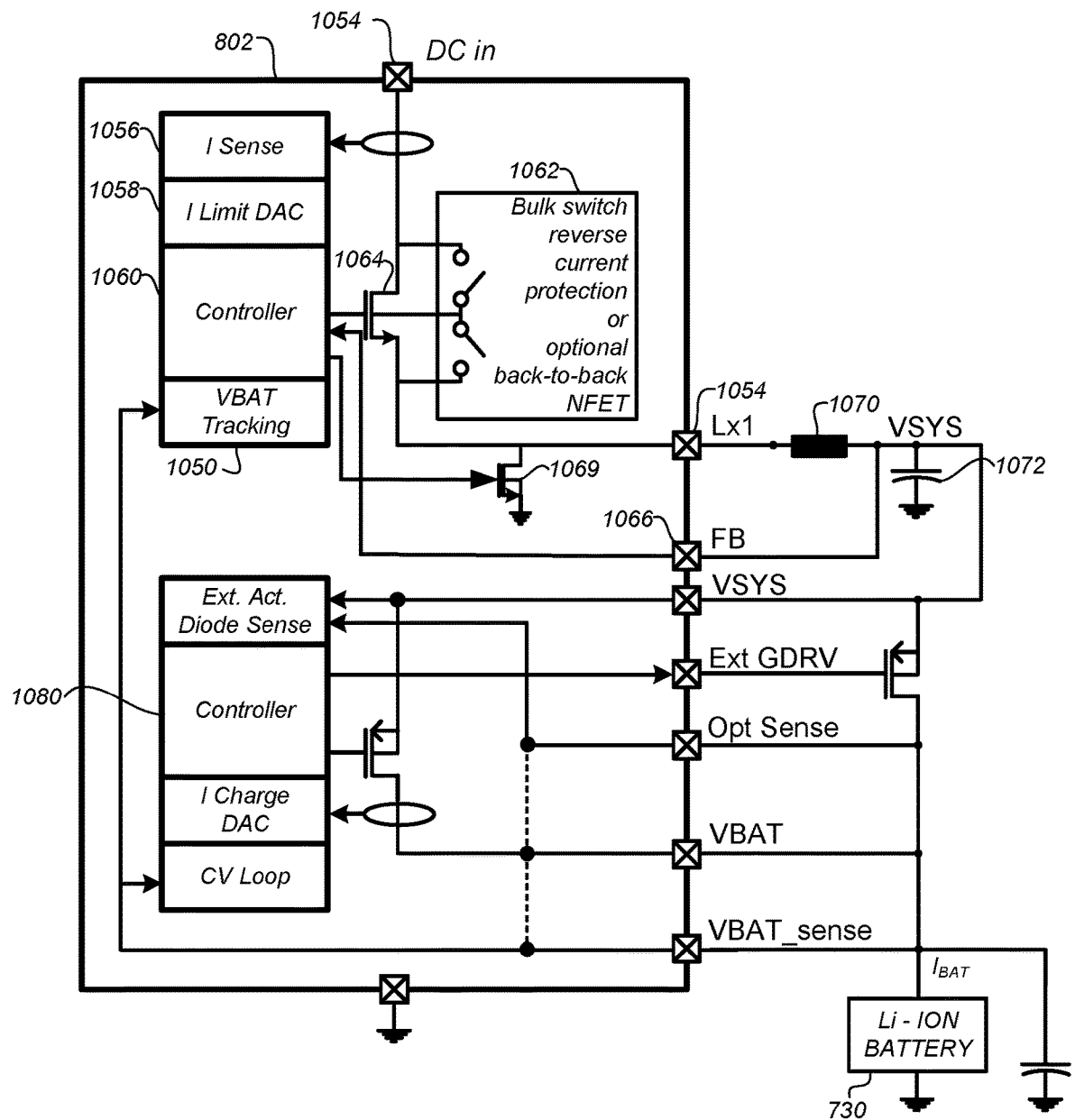
FIG. 10C illustrates an internal current limit and buck converter circuit using an internal FET rather than an external diode.

An external diode 1068 may be added at the Lx1 output on pin 1055. However, because the buck converter is internal to the PMIC 802, the external diode 1068 may also be moved to be internal to the PMIC 802 as well. In some embodiments, the external diode 1068 may be replaced by an internal FET that is connected to ground with the gate voltage controlled by the controller 1060. FIG. 10C illustrates an internal current limit and buck converter circuit using an internal FET 1069 rather than an external diode 1068. An inductor 1070 may also be provided at the output between the Lx1 pin 1055 and the VSYS capacitor 1072. The value of the inductor may be in the range of 10-470 µH. The VSYS capacitor 1072 may be used to stabilize the output from the current-limited buck converter inside the PMIC 802. In cases where the DC input at pin 1054 comes directly from the rectifier bridge 720, the voltage on the VSYS capacitor 1072 may be the highest voltage relative to all of the other power converters in the thermostat.

The PMIC 802 may use the voltage on the VSYS capacitor 1072 to power the rest of the voltage regulators in the system described above. It should be noted that this configuration increases the efficiency of the overall power system dramatically because one of the regulators has been removed. For example, the buck regulator 724 and the LTC 728 in FIG. 7 can be replaced by the PMIC circuit in FIG. 10B such that the Vcc Main in FIG. 7 becomes the voltage on the VSYS capacitor 1072 in FIG. 10B. As a further example, the digitally programmable current limit 822, the main supply, and the buck regulator 724 in FIG. 9 can be replaced by the circuitry described thus far in FIG. 10B. The VSYS capacitor 1072 can then provide the energy for the power management unit, the other buck converters, the LDOs, etc., on the PMIC 802 that are described above in FIG. 8.

The bottom portion of the circuit in FIG. 10B forms a linear battery charger. The voltage on the VSYS may be provided to the battery 730 through an internal FET 1075. An external FET 1074 may be used in cases where the system desires a lower resistance between the battery 730 and the VSYS rail than what can be otherwise provided by the internal FET 1075. The external FET 1074 is optional, and may only be needed to discharge the battery 730. The controller 1060 can regulate the voltage on the VSYS capacitor 1072 to be one voltage drop (e.g. 200-300 mV) higher than the desired voltage on the battery 730. When the battery is charging, the voltage level on the VSYS capacitor 1072 can be lowered to be just above the voltage on the battery 730 (e.g., within 500 mV). It should be noted that allowing VSYS to drop can also make the internal regulators of the PMIC more efficient. As the charge on the battery 730 increases, the controller 1060 can increase the voltage on the VSYS capacitor 1072 to track with the battery voltage as it is charged.

In order to allow the VSYS capacitor 1072 voltage to track with the voltage of battery 730, a feedback loop is provided to the current-limiting circuit. Specifically, the VBAT_sense input to the PMIC 802 can be fed back into a battery voltage tracking circuit 1050. In other embodiments, the signal on the VBAT_sense pin can be internally connected to the signal on the VBAT pin, making the VBAT_sense pin optional in some designs. The benefit of a dedicated VBAT_sense pin is to reduce the impedance from the battery 730 to the internal sensing circuit. Such impedance sources might include the battery connector, traces on the circuit board, wire bond impedance into the IC package, and/or pads and metallization on the IC. The battery voltage tracking circuit 1050 can perform at least two functions. First, it can provide a minimum output voltage—independent of the actual battery voltage—that is required by the other regulators in the PMIC. This prevents a low battery voltage from causing the internal voltage rails to sag when VSYS is lowered when charging a drained battery. For example, if the internal memory requires 3.3 V, then the battery voltage tracking circuit 1050 would provide a minimum voltage of 3.3 V regardless of the battery voltage. Second, the battery voltage tracking circuit 1050 tracks the voltage on the battery 730 and compares the battery voltage to the minimum voltage. After this comparison, the battery voltage tracking circuit 1050 provides the higher of the two voltages to the controller 1060 as a target voltage for VSYS. Conceptually, a converter needs a closed current loop and a closed voltage loop. The current sense 1056 effectively closes the current loop, while the battery voltage tracking circuit 1050 and FB pin from the VSYS capacitor 1072 effectively closes the voltage loop.

Block 1062 represents a circuit that provides reverse current protection. In some situations, the voltage on the VSYS capacitor 1072 can be supplied by the battery 730. When the voltage on the battery 730 is high and the voltage on the DC input 1054 is lower than the battery, the VSYS capacitor 1072 can receive voltage from the battery 730. This could cause current to flow backwards through the DC input 1054, which would cause leakage and possibly cause the device to erroneously try to regulate the reverse current. Block 1060 can be used to prevent this reverse-current effect from occurring. In some embodiments, block 1062 can be implemented using back-to-back NFETs such that the current flow can be turned off in both directions. The back-to-back NFETs can be used for high voltage applications. In other embodiments, one of the NFETs can be replaced with a bulk switch that determines the direction of the current flow. The solution may be advantageous because the bulk switch is typically half the size of the NFET in the silicon die. Other embodiments can also use a PFET.

The lower portion of the circuit in FIG. 10B illustrates a linear battery charger that receives voltage from VSYS. The controller 1080 can control the voltage on FET 1075 to provide a battery charging voltage at VBAT. The Optional Sense (Opt Sense) input can provide the controller 1080 with a voltage measurement after the external FET voltage drop. In some embodiments, the Opt Sense, the VBAT, and the VBAT_sense pins can all be combined into a single pin externally and separated internally. In some embodiments, the Ext GDRV and the Opt Sense pins can be omitted entirely or combined to stay separate from the VBAT pin's sourcing/sinking of current. In some embodiments, it is possible to combine VBAT and both sense pins and then separate these signals internal to the IC, but this may affect the performance of the circuit.

Figure 11:
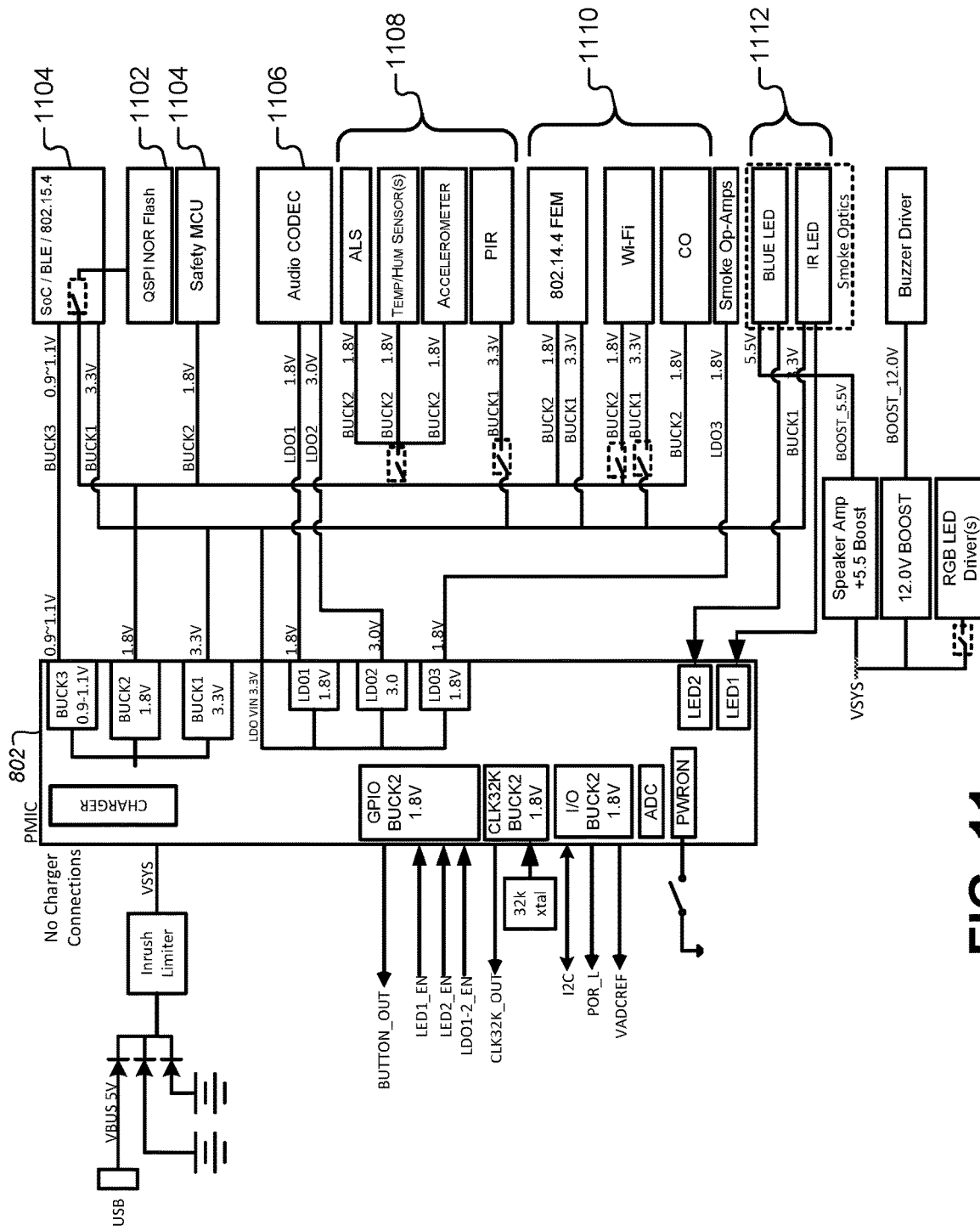
FIG. 11 illustrates an embodiment of a smart-home hazard detector that also uses the PMIC of FIG. 8.

The versatility of the PMIC 802 also allows for its advantageous integration into other types of smart-home devices in addition to the smart home thermostat described above. For example, FIG. 11 illustrates an embodiment of a smart-home hazard detector that also uses the PMIC 802 to provide voltage rails of various levels to different systems in the smart-home hazard detector. Generally, a hazard detector will not need to harvest power from an external environmental system. Therefore, in the embodiment of FIG. 11 the charger of the PMIC is not connected to an external rechargeable battery. Instead, the power from the inrush limiter can be provided directly to the PMIC 802 through the VSYS pin. From this, the buck converters 804 can be set to appropriate levels, such as 0.9 V-1.1 V, 1.8 V, and 3.3 V, and the LDOs 806 can be set to 1.8 V, 3.0 V, and 1.8 V. These voltage rails can be used to provide power to various memories 1102, SoCs/MCUs 1104, an audio codec 1106, various sensors 1108, onboard radios 1110, LED indicators 1112, and so forth.

In some embodiments, smart home devices, such as the hazard detector of FIG. 11 may also include rechargeable batteries that are maintained for backup purposes in the case of emergency or power-outage scenarios. In these types of devices, the PMIC 802 can charge the rechargeable battery using the connections depicted in FIG. 10. In other embodiments, power may be externally provided from a reliable source, and the PMIC 802 can be connected to such a source as depicted in FIG. 11 while also maintaining a rechargeable battery as in FIG. 10. One having skill in the art will be able to use the connections to various device systems depicted in FIGS. 10-11 to provide similar voltage rails to other types of smart-home devices. For example, the PMIC 802 may be used in devices that are part of a wireless home security system, including video cameras, speakers, microphones, door sensors, and so forth. The PMIC 802 may also be used in any of the other smart-home systems described above in relation to FIG. 1. The versatility of the PMIC 802 may also allow it to be used in other portable electronic devices, such as smart phones, PDAs, and other portable computing devices.

Figure 12:
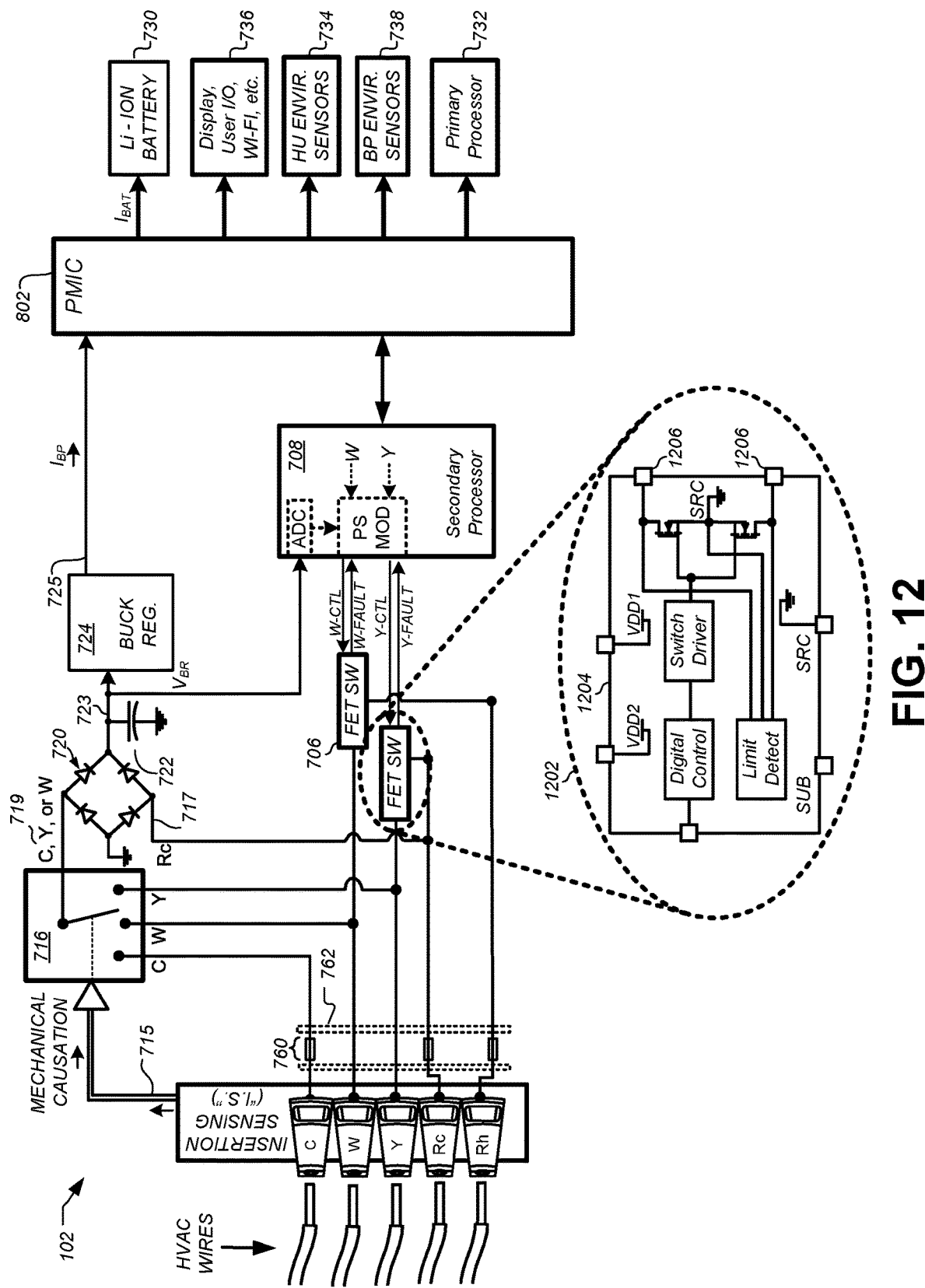
FIG. 12 illustrates a block diagram of a FET switch used to control the functionality of the HVAC system.

FIG. 12 illustrates a block diagram of a FET switch 706 used to control the functionality of the HVAC system. As described above, the thermostat may basically act as an intelligent switch for making connections between pairs of wires from the HVAC system in order to activate various HVAC functions, such as air conditioning or heating. The FET switches 706 may be implemented as simple relays in some embodiments. However, in advanced thermostats, such as the smart-home thermostat described above, the FET switches may include more advanced switching mechanisms and monitoring/diagnostic features as described below.

The expanded view 1202 of the FET switch 706 in FIG. 12 shows an integrated circuit 1204 that includes a pair of high-voltage CMOS FET switches that connect the primary inputs and outputs 1206. The pair of inputs/outputs 1206 may be configured to receive a 24 VAC signal from the HVAC system. As described above, in order to actuate an HVAC function of the HVAC system, the thermostat can connect a call relay wire to a corresponding power return wire. For example, to turn on an air conditioner, the thermostat can connect a Y call relay wire to an $R_c$ power return wire. The pair of switches can be used to make this connection. Some of the embodiments described herein may include solid-state switching elements in the place of traditional relays as the pair of switches. Solid-state switching elements may offer advantages such as the ability to rapidly switch on and off, and to do so relatively silently compared to traditional relays. Solid-state switching elements may be of particular importance in thermostats with power stealing capabilities. For example, during active power stealing when the thermostat is actively calling for an HVAC function by connecting a power return wire to a call relay wire, power stealing circuitry may need to momentarily disconnect the power return wire from the call relay wire in order to generate a voltage differential across these terminals. The power stealing circuitry can then use the voltage differential to charge power storage elements, such as capacitors and/or rechargeable batteries. However, the call relay wire should only be disconnected from the power return wire momentarily, such that the current in the transformer of the HVAC system does not dissipate enough to turn off the HVAC function. Therefore, high-speed switching elements, such as solid-state switches, may be beneficial in power stealing thermostats.

In this particular embodiment, two or more field effect transistors (FETs) may be used as switching elements. A switch driver circuit can provide an output voltage to bias the gate of each of the FETs in order to control their operation. The switch driver circuit can be controlled by a digital control unit that receives signals from, for example, the secondary processor 708 to open/close the pair of switches. It will be understood that other numbers and/or types of switching circuit elements may be used in place of the FETs of FIG. 12 without departing from the scope of the present disclosure.

In order to detect a power anomaly across the pair of input/output switches, a limit detection module can monitor the drain-to-source voltages of the FETs. These voltage measurements can be used to detect abnormally high voltage levels across the pair of switches. These voltage measurements can also be used to calculate abnormally high currents running through the FETs. For example, the limit detection module can use the measured voltage difference between the drain and source of the FETs in order to determine when the current running through the FETs has reached an excessive level. The precise voltage/current levels detected by the limit detection module may vary with each embodiment and potential application. For example, one thermostat embodiment may allow currents ranging between approximately 3.3 A to 7.2 A depending on temperature (which in turn may range between −40 C and 125 C), with a typical value of 5.5 A at normal operating temperatures. Some embodiments may use a tighter acceptable current range, such as 3.5 A to 3.95 A. In one dual-FET embodiment, the two FETs combined may include an on-resistance of between 75 mΩ and 200 mΩ in a temperature range of between −10 C and 60 C, with a typical value of approximately 105 mΩ. The limit detection module may allow for momentary glitches of high current/voltage without tripping. For example, one embodiment may allow high voltage/current glitches lasting less than approximately 25 μs to pass without triggering a response by the limit detection module.

The integrated circuit 1204 may also include voltage isolation circuitry that isolates the rest of the thermostat from the relatively high voltages/currents that may be received through the input/output ports 1206. In some embodiments, capacitive and/or inductive isolation may be used. In other embodiments where particularly high voltages may be common, RF or optical isolation techniques may also be used. The digital control can communicate with the switch driver through the high voltage isolation circuitry by using, for example, pulsed square wave patterns that are combined with enable signals.

In FIG. 12, the secondary processor 708 may play an important role in a power stealing cycle. The secondary processor 708 monitors the voltage on the storage capacitor 722 and provides the signals to the integrated circuits 1204 to open/close their internal FET switches to both activate HVAC cycles and to momentarily open the FET switches to generate a voltage differential required to charge the storage capacitor 722 through power stealing. The secondary processor 708 has an internal ADC that monitors the voltage on the storage capacitor 722. Therefore, in the embodiment of FIG. 12, the integrated circuit 1204 that actually performs the switching operation to connect pairs of HVAC wires is not "aware" of any timing requirements or external voltages that are used to control the FET switches. Instead, the secondary processor 708 is in charge of monitoring voltage, establishing timing requirements, determining when a power harvesting cycle should begin/end, and so forth.

Figure 13A:
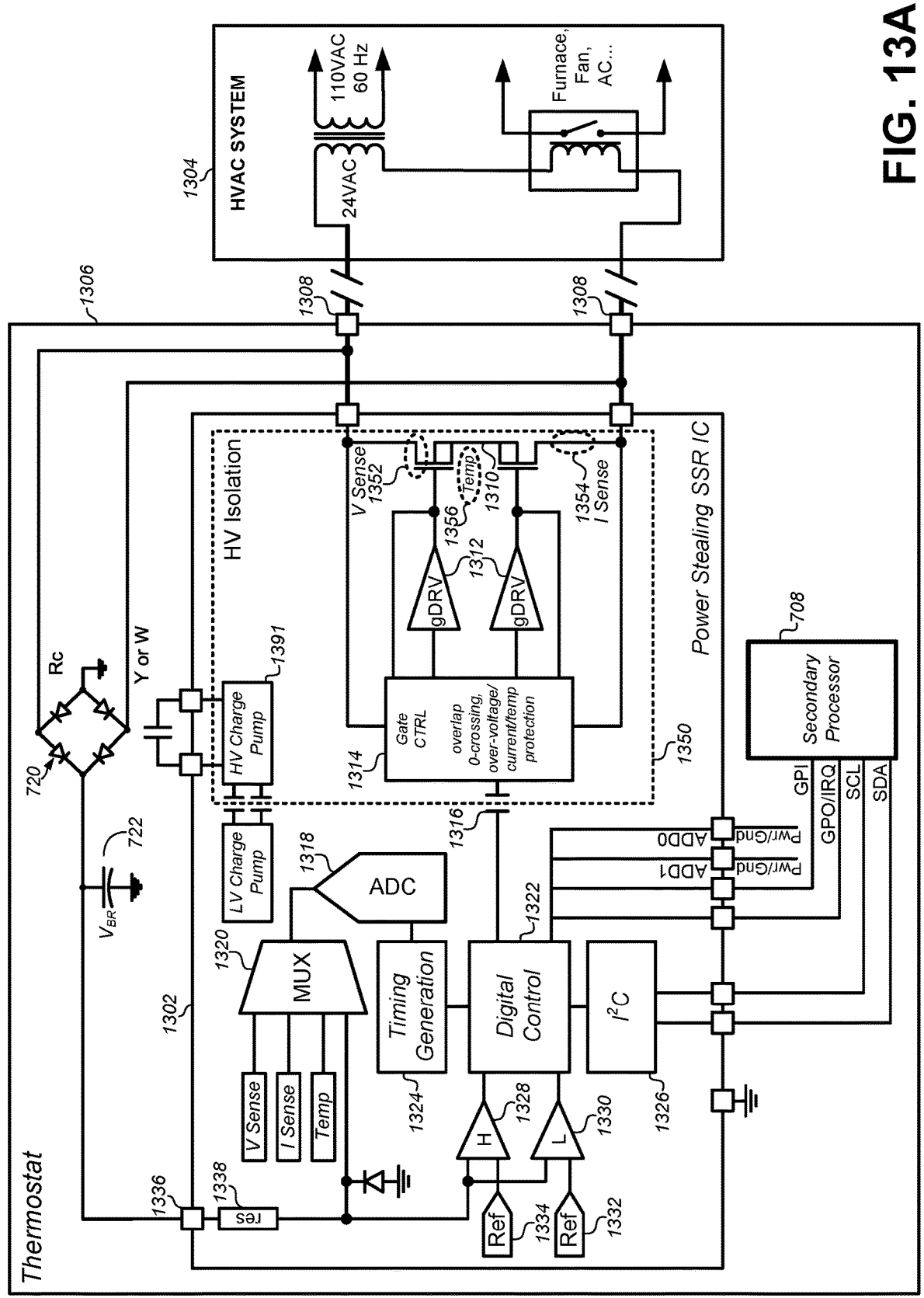
FIG. 13A illustrates an embodiment of a solid state relay (SSR) switching integrated circuit (IC).

FIG. 13A illustrates an embodiment of a solid state relay (SSR) switching integrated circuit (IC) 1302 that combines high voltage isolation and gate control of the FET switches with digital control, timing generation, a digital communication bus, voltage references and comparators, and other onboard monitoring/diagnostic systems. Two wires from the HVAC system 1304 (e.g., a Y wire and an Rc wire) can be connected to the thermostat 1306 through a pair of HVAC wire connectors 1308 configured to receive those particular HVAC wires. The 24 VAC signal between the HVAC wires can be fed into the full-wave bridge rectifier 720 as shown in FIG. 13A. That rectified signal can continue to store charge on the storage capacitor 722 as described above. However, instead of feeding the voltage signal from the storage capacitor 722 into the secondary processor, that voltage level can instead be provided to a pin 1336 of a SSR switching IC 1302.

The SSR switching IC 1302 may include a single integrated circuit (IC) package that incorporates all the functionality shown in FIG. 13A into a single fabrication process. The pin 1336 can be designated as a voltage input to be measured by the SSR switching IC 1302. The voltage input can be passed through an optional resistor 1338, and then fed into the internal circuitry of the SSR switching IC 1302. Resistor 1338 may work with a diode to ground to protect the SSR switching IC 1302 in cases where a higher voltage may be present on V_SENSE. Some embodiments may also include fuses outside the SSR switching IC 1302. For example, a resettable PTC fuse between the diode bridge 720 and ground may be present. Other fuses may be present between the wire connectors for Rh, Rc, and C, and the rest of the circuits inside the thermostat, such as the diode bridge 720 and the SSR switching IC 1302. The SSR switching IC 1302 may operate the function of a resettable fuse conceptually, since it has over-current and over-voltage detection, and can turn itself on/off. In the context of power stealing, the SSR switching IC 1302 can be responsible for measuring and monitoring the voltage on the storage capacitor 722. In some embodiments, a multiplexer 1320 can receive a number of different analog inputs from different portions of the SSR switching IC 1302, including the voltage VBR input through pin 1336 from the storage capacitor 722. For example, inputs may include a voltage "V Sense" measured across the switching FETs 1310, a current "I Sense" measured through the switching FETs 1310, and/or a temperature measurement from a temperature sensor near the switching FETs 1310. The multiplexer 1320 can select one of these analog inputs as an input to an analog-to-digital converter (ADC) 1318, which can convert the analog signal into a digital signal for a timing circuit 1324, and/or a digital control circuit 1322.

The voltage VBR on the storage capacitor 722 received through pin 1336 can also be fed into a pair of analog comparators 1328, 1330. These can be used to compare the voltage VBR on the storage capacitor 722 to a lower threshold and an upper threshold represented by voltage reference 1332 and voltage reference 1334, respectively. In some embodiments, the voltage references 1332, 1334 can be hardcoded into the SSR switching IC 1302. In some embodiments, the voltage references 1332, 1334 can be received from external circuits through pins (not shown) of the SSR switching IC 1302. For example, an external voltage divider could be coupled to an input pin of the SSR switching IC 1302 to provide the voltage references 1332, 1334. In some embodiments, the voltage references 1332, 1334 can be set digitally by the digital control 1322 and fed into the comparators 1328, 1330. For example, the secondary processor 708 can send commands via an I²C bus controller 1326 to the digital control 1322 of the SSR switching IC 1302 to digitally set the voltage references 1332, 1334. In these embodiments, the digital control 1322 can provide a pair of programmable analog outputs through a digital-to-analog converter (DAC) to serve as the voltage references 1332, 1334. One advantage of this embodiment is that different values for the reference voltages 1332, 1334 can be instantiated via a software update or other digital communications between secondary processor 708 and a remote site, such as a smartphone or workstation of a technician or customer support agent who may be troubleshooting the smart-home device. Alternatively, the updating of reference voltages 1332, 1334 (or any other programmable voltage or setting on the smart-home device) can be carried out as part of a larger-scale product update across a large population of smart-home devices. By way of example, for the specific case of a smart thermostat, in the years after thermostat installation, it might be found one day by the thermostat manufacturer that certain HVAC systems branded "XYZA" may have a certain defect or sensitivity for which it is best to modify these reference voltages on the associated thermostat, and a large-scale update for all thermostat customers known to have HVAC system "XYZA" can be issued to remedy the issue promptly, without requiring large scale technician visits to homes, large-scale product replacements, product recalls, or the like.

In the context of power stealing, the SSR switching IC 1302 can monitor the voltage on the storage capacitor 722 in real time to determine when the switching FETs 1310 need to be turned on/off. When an HVAC function involving the HVAC wires connected to the SSR switching IC 1302 has been initiated, the voltage differential between the HVAC wire connectors 1308 will be at or near zero because the switching FETs 1310 will be turned on. Because there is no voltage differential, no power can be harvested from the HVAC system 1304 when the FET switches 1310 are closed. Therefore, as described in detail above, active power stealing while the HVAC function is active may include opening the FET switches 1310 for brief intervals to generate the required voltage differential between the HVAC wire connectors 1308.

Specifically, the FET switches used in HVAC applications need to switch what can be a relatively high inductive load of the HVAC system for brief instances during power stealing. When the HVAC function is active and the FET switches 1310 are on, briefly turning the FET switches 1310 off can generate an inductive kickback voltage that is generated by the HVAC relay and/or the HVAC transformer. This kickback voltage can be fed directly through the full-wave bridge rectifier 720 and into the storage capacitor 722. In some embodiments, the gate control unit 1314 can detect zero crossings of the input AC waveform from the HVAC system and turn on/off the switching FETs 1310 at zero crossings, thereby reducing stress on the FET switches 1310. Additionally, the gate control 1314 can ensure that there are no shoot-through currents so that the switching FETs 1310 turn off correctly. In other embodiments, the zero-crossing detection can alternatively turn on the switching FETs 1310 at a peak voltage rather than a zero crossing voltage. Similarly, the switching FETs 1310 can be turned off at a zero-crossing for the current waveform, which can reduce the kickback.

Although not shown explicitly in FIG. 13A, some embodiments may include a lead from the pair of gate drivers 1312 that extends to a pad and I/O pin on the SSR switching IC 1302. This pin can be bonded to a bond-out pad when not in use. However, in other embodiments, this pin could be tied to the gate of additional external switching circuits. For example, high-voltage FETs could be used for different applications with higher load voltages. These high-voltage FETs could be mounted on the circuit board with the SSR switching IC 1302 and connected to these pins. Therefore, the SSR switching IC 1302 could be used to control external switches for a wide variety of applications using the same serial bus commands from the secondary processor 708.

In the embodiments described herein, the SSR switching IC 1302 can provide new control methods for power stealing using the inductive kickback voltage generated by the inductive loads of the HVAC system. The timing circuit 1324 can receive a digital representation of the voltage on the storage capacitor 722 through the ADC 1318. The timing circuit 1324 can also receive signals originating from the comparators 1328, 1330 indicating whether the voltage on the storage capacitor 722 has crossed the upper and/or lower thresholds. The timing circuit 1324 can then generate timing signals for the digital control 1322. These timing signals can be passed into the gate control circuit 1314 for the switching FETs 1310.

The digital control 1322 can communicate with the gate control circuit 1314 through a high voltage isolation circuit 1316. For example, capacitive or inductive coupling can be used to isolate the circuitry inside the high voltage isolation boundary 1350 from the rest of the SSR switching IC 1302 and the thermostat 1306. For example, clocked square wave pulses can be used in conjunction with digital enable signals from the digital control 1322 in order to send signals through the high voltage isolation circuit 1316 into the gate control 1314. The gate control 1314 can be used to drive a pair of gate drivers 1312 that turn on/off the switching FETs 1310. A charge pump 1391 may be included with an external capacitor to move energy from the low-voltage circuitry of the SSR switching IC 1302.

In some embodiments, diagnostic sensors can be located near the switching FETs 1310 to provide real-time and historical diagnostic information that can be recorded by the SSR switching IC 1302 and used for real-time control operations and/or later diagnostic operations. For example, a temperature sensor 1356, a current sensor 1354, and/or a voltage sensor 1352 can be located near the switching FETs 1310. The current sensor 1354 can measure a current passing through the switching FETs 1310. The voltage sensor 1352 can measure a voltage across the switching FETs 1310. The temperature sensor 1356 can monitor the temperature on the IC near the switching FETs 1310. Each of the sensor readings may be recorded by the gate control 1314 and passed through the high voltage isolation circuit 1316 to the digital control 1322 of the SSR switching IC 1302. In other embodiments, analog outputs of the sensors can be passed through the high voltage isolation boundary 1350 and provided as inputs to the multiplexer 1320. The digital control 1322 can include one or more memory elements that store historical data recorded from the voltage sensor 1352, the current sensor 1354, and/or the temperature sensor 1356. In some embodiments, the digital control 1322 can pass these values to the secondary processor 708 through the I²C controller 1326.

The secondary processor 708 can communicate with the SSR switching IC 1302 through a bus protocol. In this particular embodiment, the SSR switching IC 1302 uses an I²C bus as an example. Other embodiments may use other bus protocols that may be provided with other processors. The I²C protocol includes a clock (SCL), a data line (SDA), and a two-bit address line that can be used to set the address of the SSR switching IC 1302. Therefore, the secondary processor 708 can communicate with a plurality of different FET switching circuits 1302 by giving each SSR switching IC 1302 a different address. The address pins (ADD0, ADD1) can be connected to external power/ground signals through pull-up/pull-down resistors to set the bus address for each SSR switching IC at the circuit-board level. For example, the thermostat 1306 may include a SSR switching IC 1302 for a heating function, a cooling function, and a fan function. Each of these different functions may be associated with a different call relay wire from the HVAC system 1304, and may further be associated with their own dedicated SSR switching IC 1302. In some embodiments, only one channel of one SSR switching IC 1302 is engaged in power stealing at any given point. The processor 708 determines which HVAC call relay wire is connected to the diode bridge 720 and modulates that particular channel on the associated SSR switching IC 1302. If a C-wire is present, then no SSR switching ICs 1302 may need to perform power stealing in some embodiments. The processor 708 may determine that none of the HVAC call channels are connected to the diode bridge 720, and thus none would be modulated. Generally, an SSR switching IC channel is used for every call wire.

In a similar design according to another embodiment, nearly all of the circuit elements outside of the high-voltage isolation barrier 1350 would be provided either by discrete circuitry on the thermostat circuit board or by internal functions of the thermostat microprocessor 708. However, by incorporating the digital control 1322, the timing generation module 1324, the ADC 1318, the multiplexer 1320, the voltage references 1332, 1334, etc., into the SSR switching IC 1302, the design can be greatly simplified and ultimately cost less to implement. Instead of sending clock pulses through the isolation barrier 1350, the thermostat processor 708 can simply send serial bus commands to the SSR switching IC 1302. Furthermore, the high-voltage isolation circuit 1316 can become a design decision internal to the SSR switching IC 1302, which can be tailored for the voltage requirements of each specific application.

Figure 13B:
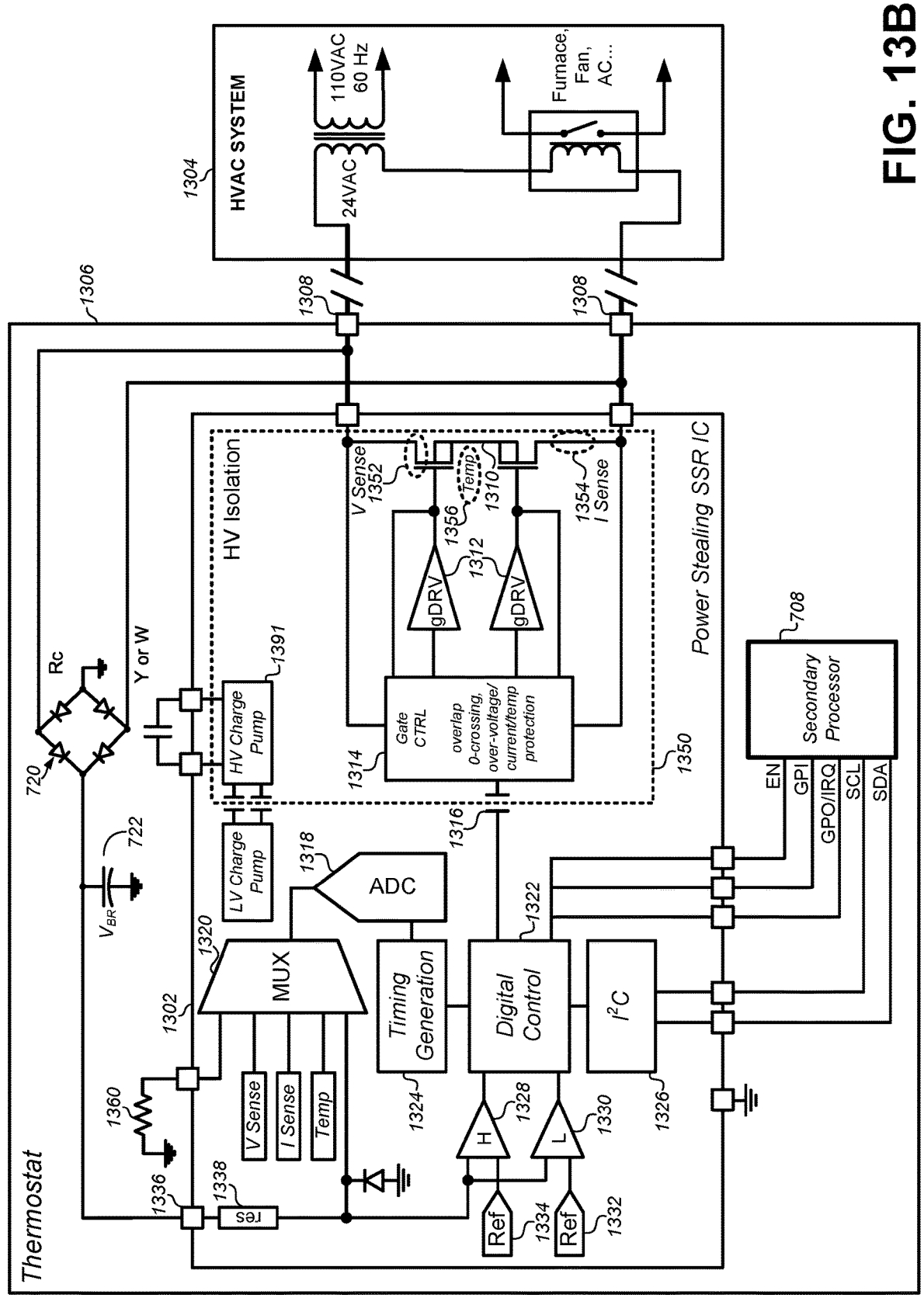
FIG. 13B illustrates a second embodiment of an SSR switching IC.

FIG. 13B illustrates an embodiment of an SSR switching IC 1302 that combines high voltage isolation and gate control of the FET switches with digital control, timing generation, a digital communication bus, voltage references and comparators, and other onboard monitoring/diagnostic systems. This embodiment is similar to the embodiment of FIG. 13A, the difference being the way in which the SSR switching IC 1302 is addressed over the serial communication bus. Recall that in a typical thermostat application, a plurality of SSR switching ICs 1302 will be used to control the switching functions of various HVAC operations. In FIG. 13A, the individual SSR switching IC's 1302 were addressed using address pins through which each individual SSR switching IC 1302 can be assigned an individual address using pull-ups/pulldowns. In the embodiment of FIG. 13B, one or more resistors 1360 may be added to pins on the SSR switching IC 1302 in order to set the address.

Some embodiments may use external pull-down resistors of various values for each SSR switching IC 1302, internal current sources that pull the resistors up, and comparators. Some embodiments may also use a single current source and the ADC 1318. The resistor value may be detected, and an I²C address may be assigned based on a range of, for example, 8 values. This allows up to 8 devices on the same I²C bus at different addresses. Instead of address lines coming from the secondary processor 708, the enable line (EN) can be used to select and enable the particular SSR switching IC 1302. While the EN line may be present in the embodiments of both FIG. 13A and FIG. 13B, the EN line in FIG. 13B can be used to control the reception of bus communications without relying on the address pins. The EN signal may also be used to provide a safe reset of the SSR switching IC to keep the protection circuits in place and turn off gracefully.

Figure 14:
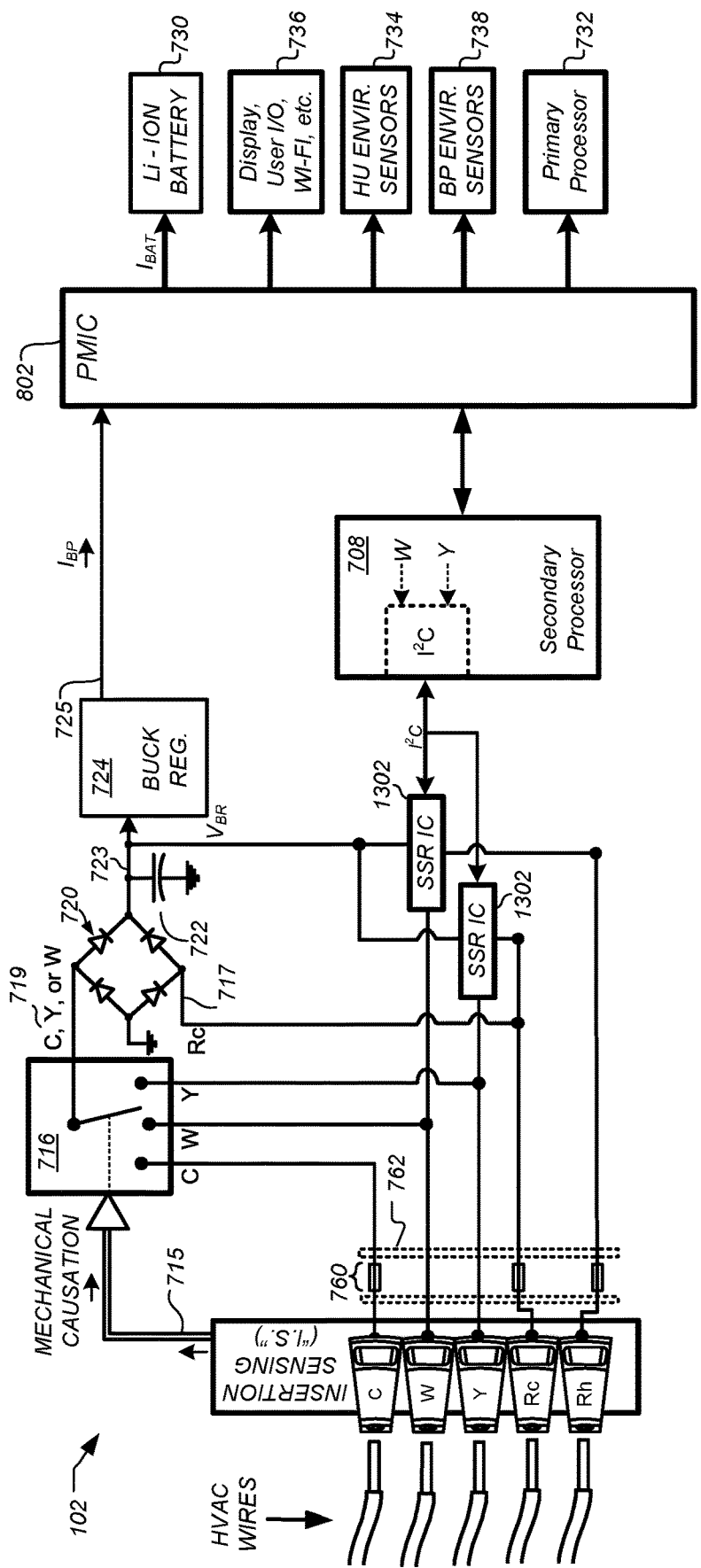
FIG. 14 illustrates a thermostat circuit architecture using the SSR switching IC, according to some embodiments.

FIG. 14 illustrates a thermostat circuit architecture using the SSR switching IC 1302, according to some embodiments. The circuit in FIG. 14 can be compared to the circuit in FIG. 12. In FIG. 14, each of the FET switches 706 have been replaced by the SSR switching IC 1302 from FIG. 13A. The individual FAULT and CTL lines have been replaced with an I²C bus that runs from an I²C port on the secondary processor 708 and connects to each of the FET switching circuits 1302 in the thermostat. Additionally, instead of sending the voltage on the storage capacitor 722 into the ADC of the secondary processor 708 as in the embodiment of FIG. 12, the voltage is sent directly to the SSR switching ICs 1302. Note that the storage capacitor 722 may still be coupled to the secondary processor 708 for other functions, but this connection between the storage capacitor 722 and the secondary processor 708 is no longer necessary for active power stealing. In operation, the secondary processor 708 can send a command on the I²C bus that is addressed to a particular SSR switching IC 1302 in order to activate an HVAC function using, for example, the W or Y wires. After activating the HVAC function, the secondary processor 708 need not actively monitor the voltages related to the power stealing for this embodiment. Instead, the FET switching circuits 1302 can independently monitor the voltage on the storage capacitor 722 and time the opening/closing of their internal FET switches based on the stored/set voltage references. In some alternative embodiments, however, the secondary processor 708 can still control the active power stealing cycles of the thermostat using a general-purpose I/O on the SSR switching IC 1302 as the switch on/off signal.

Figure 15:
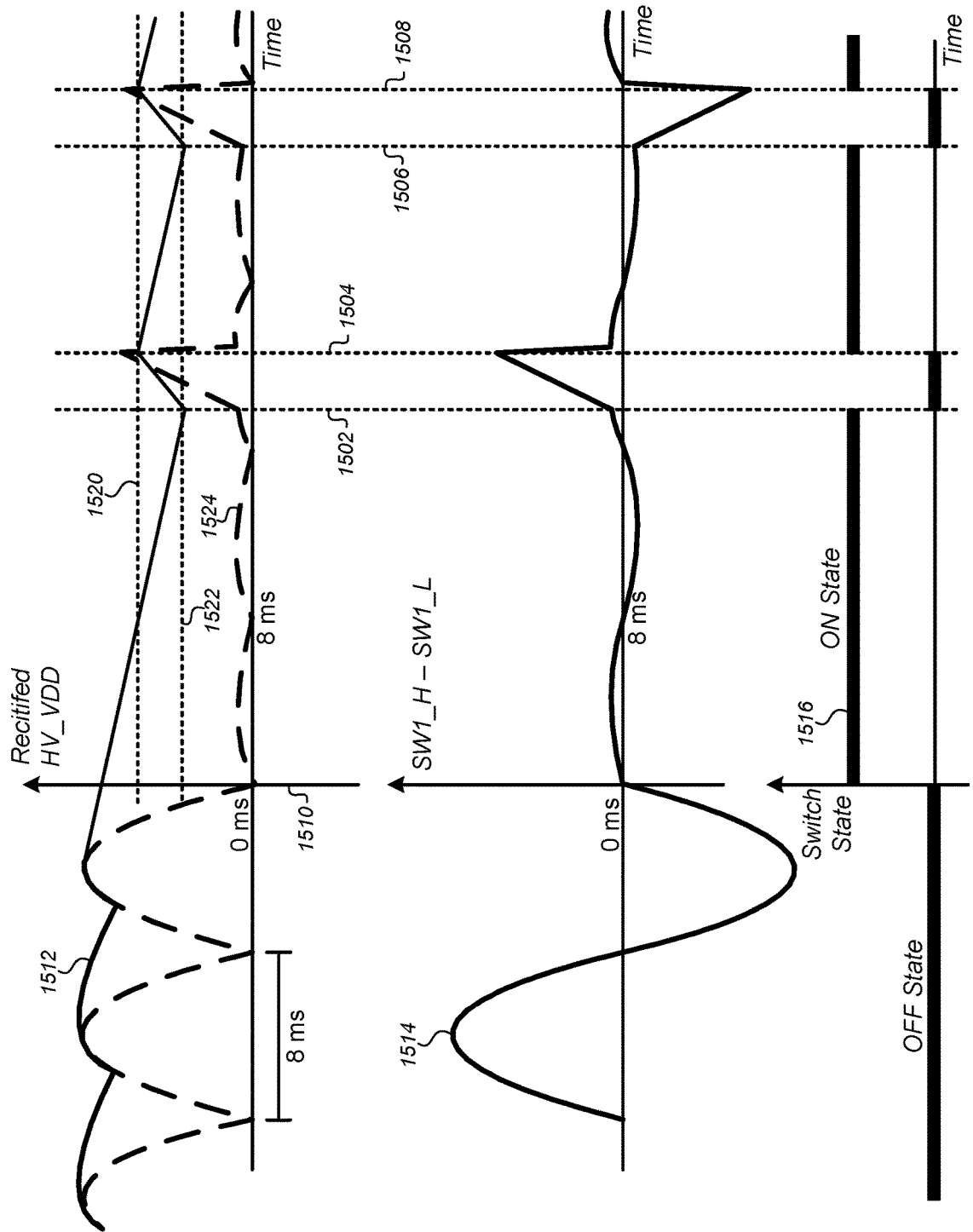
FIG. 15 illustrates a timing diagram using minimum and maximum thresholds to control power stealing intervals, according to some embodiments.

FIG. 15 illustrates a timing diagram using minimum and maximum thresholds to control power stealing intervals, according to some embodiments. In this embodiment, the timing circuit 1324 of FIG. 13A can use the voltage references 1332, 1334 and the comparator outputs 1328, 1330 to generate timing signals for the gate control 1314 for the FET switches 1310. Specifically, when the voltage on the storage capacitor 722 dips below the level of the lower voltage reference 1332, the output of the comparator 1330 will go high. In response, the timing generation circuit 1324 can cause the digital control 1322 to issue a command to the gate control 1314 to open the FET switches 1310. Opening the FET switches 1310 will generate a voltage differential across the two HVAC wire connectors 1308. This voltage differential can be used to begin recharging the storage capacitor 722 through the full-wave bridge rectifier 720.

As described above, the FET switches 1310 can only stay open for a short amount of time during an active HVAC cycle. Otherwise, opening the switches will cause the trigger circuit of the HVAC system 1304 to turn off the HVAC function. For example, opening the connection between the Y and $R_c$ wires for an extended length of time will turn off the air-conditioning function of the HVAC system. The goal of the SSR switching IC 1302 is to open the FET switches 1310 for a time interval that is long enough to charge the storage capacitor 722, but not long enough to turn off the triggering circuit of the HVAC system 1304.

Turning back to FIG. 15, voltage 1514 represents the voltage between the HVAC wire connectors 1308. Voltage 1512 represents the voltage VBR on the output of the full-wave bridge rectifier 720 that is stored on the storage capacitor 722. Signal 1516 represents the state of the FET switches 1310. Prior to time 1510, the associated function (e.g., air-conditioning) of the HVAC system 1304 is not activated, and thus signal 1516 indicates that the FET switches 1310 are in the OFF state. Voltage 1514 oscillates, representing the full 24 VAC signal from the HVAC system. This causes the voltage 1512 on the storage capacitor 722 to remain comfortably above the upper threshold 1520.

At time 1510, the HVAC function can be activated, and signal 1516 indicates that the FET switches 1310 transition to the ON state. In this embodiment, the system turns on at a zero crossing at time 1510 for the input AC voltage signal. In other embodiments, the system can instead turn on at a time corresponding to a voltage peak of the input AC voltage signal instead of at a zero-crossing. When the FET switches 1310 are closed, the voltage 1514 across the HVAC wire connectors 1308 is greatly reduced. Consequently, the rectified voltage 1524 drops below the voltage 1512 on the storage capacitor 722. The rectified voltage 1524 represents a theoretical output of the rectifier if the storage capacitor 722 were not present. Since the storage capacitor 722 is coupled to the output of the rectifier, this voltage would be equal to the voltage on the storage capacitor 722 because the bridge diode would not conduct. Because the charge on the storage capacitor 722 is used to provide power to the PMIC 802 for operating the thermostat and charging the rechargeable battery 730, the charge 1512 on the storage capacitor 722 begins to drop, as it is no longer being constantly recharged by a higher rectified voltage from the full-wave bridge rectifier 720.

At time 1502, the voltage 1512 drops below the lower threshold 1522. This lower threshold 1522 can be determined by the lower voltage reference 1332. In response, the timing generation circuit 1324 can cause the digital control 1322 to issue a command to the gate control 1314 of the SSR switching IC 1302 to temporarily transition the FET switches 1310 to the OFF state. After time 1502, voltage 1514 on the HVAC wire connectors 1308 begins to rise sharply as a result of the inductive kickback from the HVAC system. The resulting charge is dumped onto the storage capacitor 722.

To determine when the FET switches 1310 should be closed, the timing generation circuit 1324 can use a number of different methods. In the embodiments of FIG. 15, the timing generation circuit 1324 can monitor the signal from the comparator 1328 that uses the high voltage reference 1334, which corresponds to the upper threshold 1520. When the voltage 1512 reaches the upper threshold 1520, the timing generation circuit 1324 can cause the digital control 1322 to issue a command to the gate control 1314 of the SSR switching IC 1302 to transition the FET switches 1310 back to the ON state at time 1504.

The time interval between time 1502 and time 1504 occurs during a positive cycle of the voltage 1514 from the HVAC system. A similar time interval between time 1506 and time 1508 occurs when the voltage 1514 from the HVAC system is in a negative cycle. The shape of the voltage signal of the inductive kickback is substantially the same as it is during the positive cycle, but the magnitude will be negative. This does not affect the charging of the storage capacitor 722 because the negative inductive kickback is made positive through the full-wave bridge rectifier 720.

Figure 16:
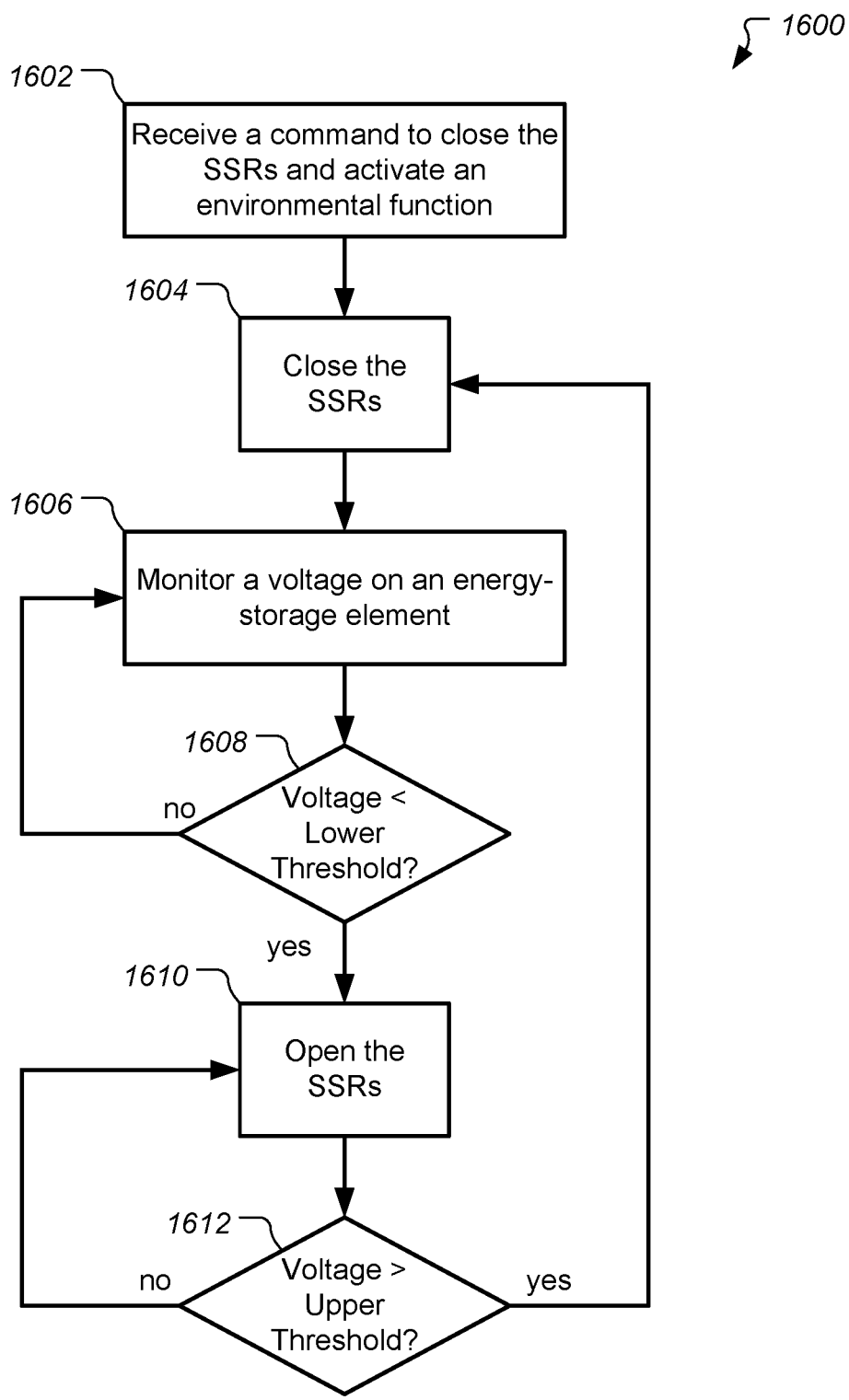
FIG. 16 illustrates a flowchart of a method for controlling power stealing using a SSR switching IC with upper/lower voltage comparators, according to some embodiments.

FIG. 16 illustrates a flowchart of a method for controlling power stealing using a SSR switching IC with upper/lower voltage comparators, according to some embodiments. Note that this method refers to the use of solid-state relays (SSRs) instead of specifically to FET switches. Although the embodiments described above use FET switches as a particular implementation, other types of SSRs may also be used, such as a single MOSFET, parallel MOSFETs, bidirectional MOSFETs, SCR or TRIAC relays, BJTs, IGBTs, and so forth. Therefore, in every instance where FET switches are used in this disclosure, other SSRs may also be used in any combination and without limitation.

This method may be carried out by the SSR switching IC 1302 of FIG. 13A as installed in the thermostat 1306. The method may include receiving a command to close the SSRs and activate an environmental function (1602). The environmental function may be associated with a particular pair of environmental control wires that are connected to the FET switching circuit, such as a Y wire and an Rc wire to activate an air-conditioning function. The method may also include causing the SSRs to close (1604) in response to receiving the command to activate the environmental function. After causing the SSRs to close, the FET switching circuit can monitor the voltage on an energy storage element (1606).

The energy storage element may include a storage capacitor, rechargeable battery, a super capacitor, and/or the like.

While monitoring the voltage on the energy-storage element, the FET switching circuit can compare the monitored voltage to a lower voltage threshold (1608). The lower voltage threshold may be provided through a pin of the SSR switching IC, programmed through a communication bus to the SSR switching IC, and/or set using internal voltage references of the SSR switching IC. As long as the monitored voltage stays above the lower threshold, the SSRs can remain closed and the SSR switching IC can continue to monitor the voltage on the energy storage element. As soon as the monitored voltage falls below the lower threshold, the SSR switching IC can cause the SSRs to open temporarily (1610). The SSRs can remain open until the monitored voltage surpasses an upper threshold (1612). When the upper threshold is crossed, the SSR switching IC can close the SSRs (1604), and then repeat the cycle of monitoring the voltage on the energy-storage element. As with the lower threshold, the upper threshold may be provided through a pin on the SSR switching IC, programmed through a communication bus, and/or set using internal voltage references.

Figure 17:
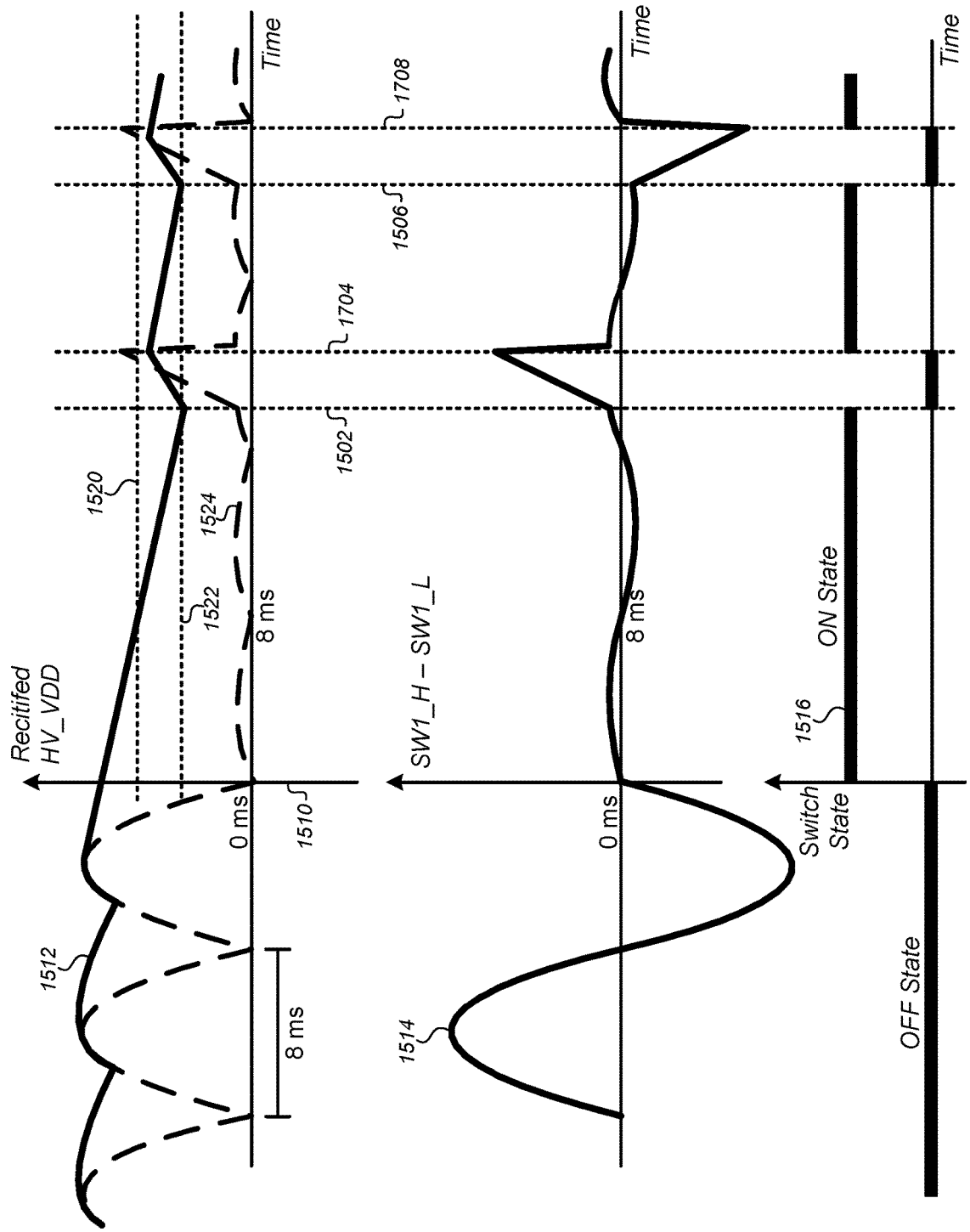
FIG. 17 illustrates a timing diagram using a minimum threshold and a timing requirement to control power stealing intervals, according to some embodiments.

FIG. 17 illustrates a timing diagram using a minimum threshold and a timing requirement to control power stealing intervals, according to some embodiments. FIG. 17 is similar to FIG. 15, the difference being that instead of using the upper threshold 1520, a time limit is used to turn off the FET switches 1310. As described above, when the voltage 1512 drops below the lower threshold 1522, the FET switches 1310 can transition to the OFF state. However, instead of remaining in the OFF state until the voltage 1512 reaches the upper threshold 1520, the FET switches 1310 can be transitioned to the ON state after a time interval has expired. This time interval is depicted as beginning at time 1502 and expiring at time 1704. For the negative cycle, the time interval begins at time 1506 and expires at time 1708. The time interval can be set using commands received from the secondary processor 708 and can be dynamically programmable.

In this example, the time interval expires before the voltage 1512 reaches the upper threshold 1520. In other embodiments, the time interval may also be longer, such that the voltage 1512 is allowed to surpass the upper threshold 1520 before the time interval expires, and thus the voltage 1512 on the storage capacitor 722 may exceed the upper threshold 1520. In some embodiments, both the time interval and the upper threshold 1520 may be used in conjunction to govern when the FET switches 1310 are transitioned back to the ON state. The timing interval may be set such that it is shorter than the length of time that would cause the HVAC system to turn off the associated HVAC function. In these embodiments, the FET switches can remain in the OFF state until either the voltage 1512 has surpassed the upper threshold 720, or the time interval has expired. These embodiments ensure that the FET switches do not remain in the OFF state long enough to disrupt the HVAC functionality, and also ensure that the power stealing interval last only as long as needed to charge the storage capacitor 722. The mode in which the SSR switching IC 1302 runs can also be dynamically set by the secondary processor 708 through the bus. For example, the SSR switching IC 1302 can be instructed to operate in a comparator-only mode, a timer-only mode, a comparator-and-timer mode, and so forth.

Figure 18:
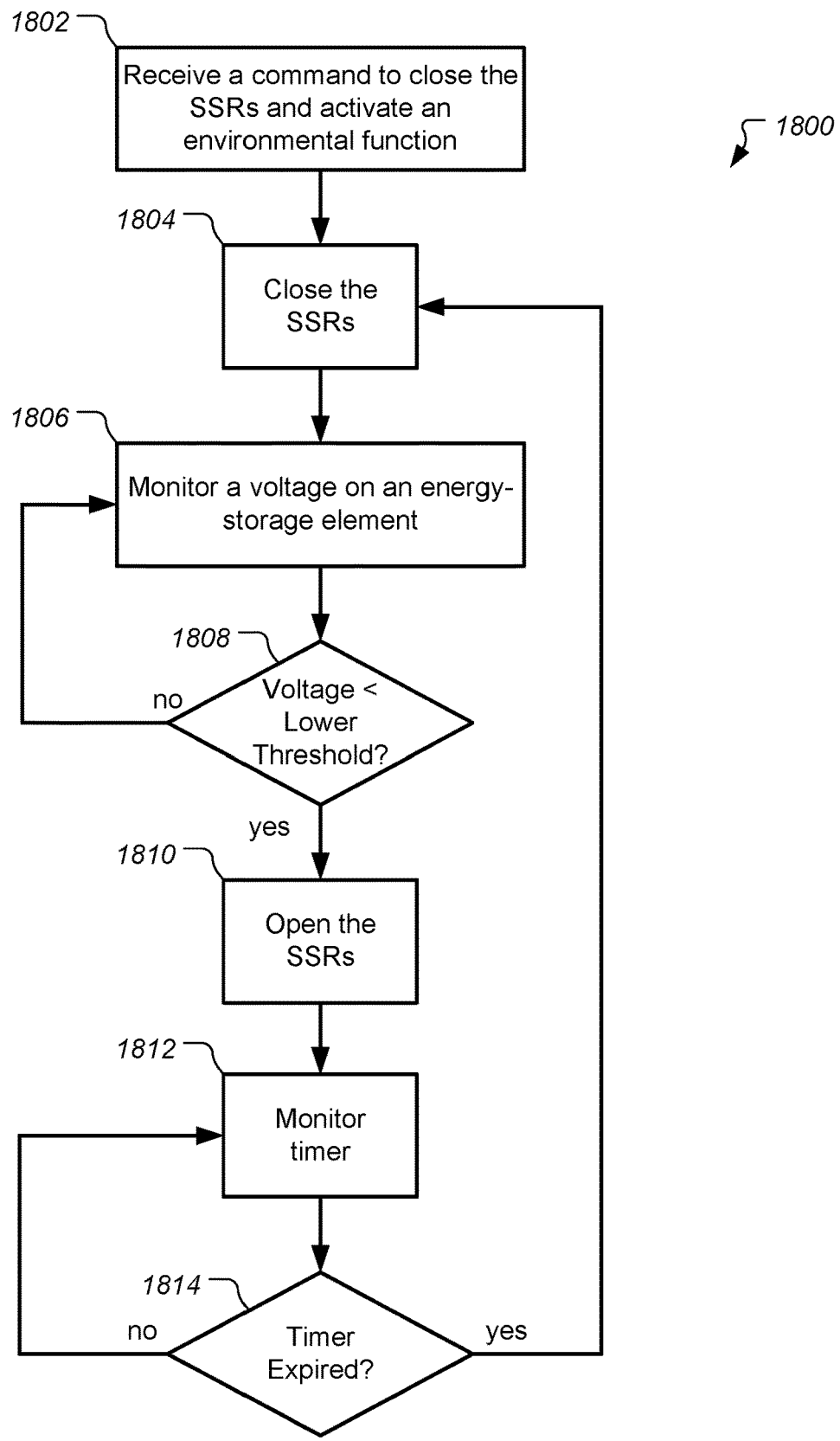
FIG. 18 illustrates a flowchart of a method for controlling power stealing using a SSR switching IC with a lower voltage comparator and a time interval, according to some embodiments.

FIG. 18 illustrates a flowchart 1800 of a method for controlling power stealing using a SSR switching IC with a lower voltage comparator and a time interval, according to some embodiments. As described above, the method may include receiving a command to close the SSRs and activate an environmental function (1802) of an environmental system, such as an HVAC system, by which the SSRs can be closed in response (1804). In some embodiments, the SSR switching IC may include one or more switching elements, such as a pair of FETs, that operate in at least two operating states. In a first operating state, the one or more switching elements may create a connection between a power wire connector of the smart-home device and a return wire connector of the smart-home device. In a second operating state, the one or more switching elements may interrupt the connection between the power wire connector and the return wire connector.

As described in detail above, the SSR switching IC may include a digital control circuit that controls the one or more switching elements. After receiving a command to activate the environmental function, for example, via the serial bus interface, the SSR switching IC can cause the one or more switching elements to operate in the first operating state described above to activate the environment function. For example, the thermostat processor can send a command to the SSR switching IC to activate a heating function by closing the FETs to create a connection between the heating call relay wire and the corresponding power return wire.

The SSR switching IC can monitor the voltage on the energy-storage element (1806) until an electrical property of the energy-storage element has dropped below a first threshold while the one or more switching elements operate in the first operating state (1808). For example, the SSR switching IC can determine when the voltage drops below a lower threshold. Some embodiments of the SSR switching IC may include one or more references, such as voltage references, that are coupled to one or more comparators that are used to compare an electrical characteristic of the energy-storage element to the references.

At this point, the SSRs can be opened to allow the power harvesting interval to begin (1810) by causing the one or more switching elements to operate in the second state described above. The SSR switching IC can monitor a timer (1812), and when the timer expires (1814) after a first time, the one or more switching elements can be closed (1804), or caused to operate in the first state again. The cycle can then restart as needed. In some embodiments, the one or more switching elements can also be closed (1804) in response to the voltage passing an upper threshold as described above for FIG. 16 as well. It will be understood that the term "one or more switching elements" may be equivalent to any of the switching technologies, such as SSRs, described herein or commercially available.

Figure 19:
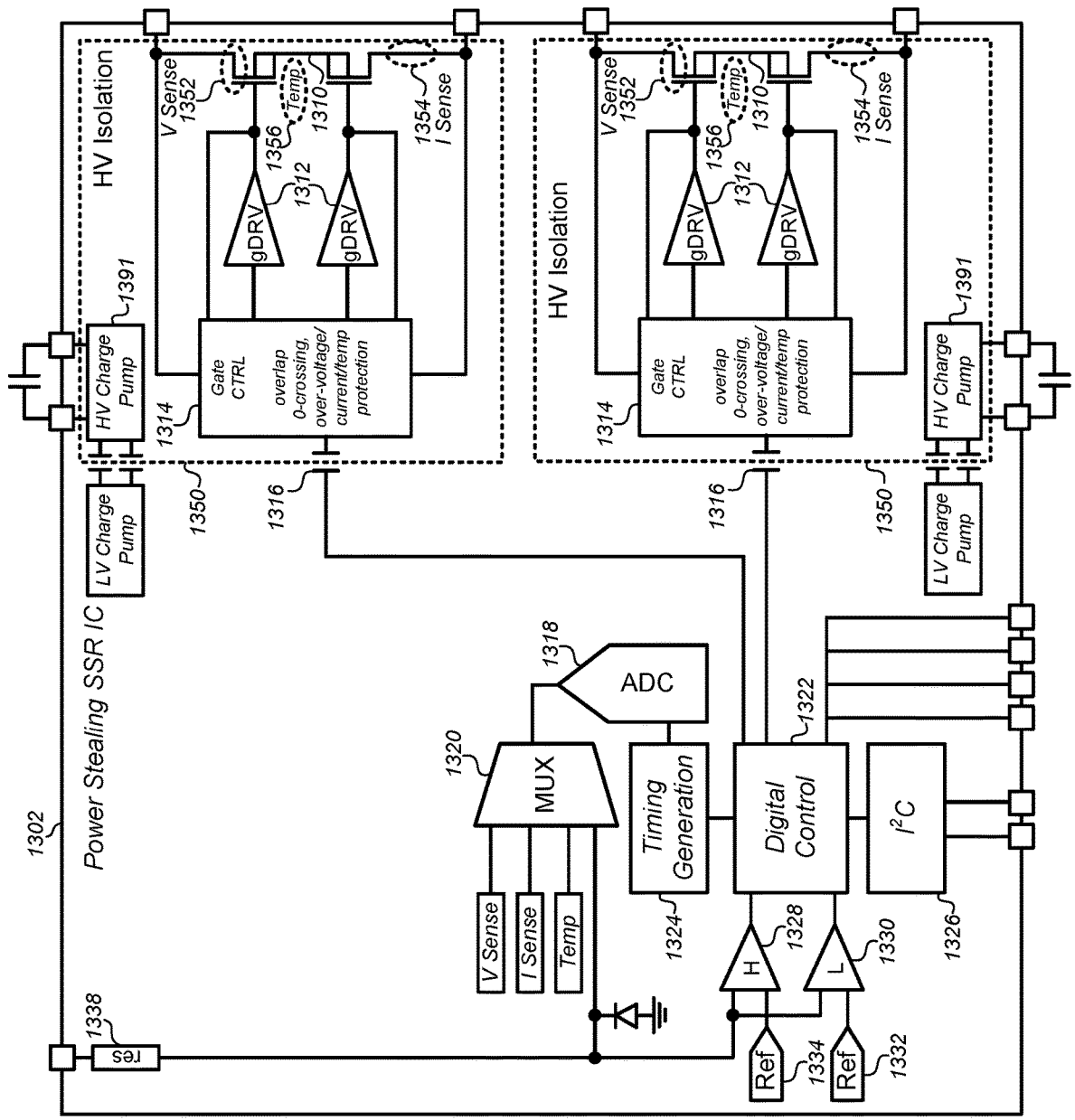
FIG. 19 illustrates an SSR switching IC with two different, parallel sets of SSR circuits.

FIG. 19 illustrates an SSR switching IC 1302 with two different, parallel sets of SSR circuits. This design integrates multiple SSR circuits, each with their own independent high-voltage isolation circuitry 1316, gate drivers 1312, and telemetry sensors (e.g., voltage sensing 1352, current sensing 1354, temperature sensing 1356, etc.) together with a single control system on the SSR switching IC 1302. The digital control 1322 can independently control each of the multiple SSR circuits based on commands received from a master controller through the serial bus and/or using sensor and other inputs indicating timing and performance characteristics of waveforms as described above.

This configuration may be advantageous when the SSR switching IC 1302 is used to control HVAC systems where the fan and cooling function are controlled by independent call relay and return wires. For example, the bottom SSR circuit in FIG. 19 may be connected to a cooling function call relay wire with a corresponding power return wire, while the top SSR circuit in FIG. 19 may be connected to a fan call relay wire with a corresponding power return wire. The SSR circuit connected to the cooling function can operate according to the power-harvesting timing protocol described in detail above, momentarily switching off in order to create a voltage difference across the input terminal such that power can be harvested from the HVAC system. Meanwhile, the SSR circuit connected to the fan can continue to operate as normal according to the setpoint schedule of the thermostat. The combination of these two functions can be controlled by a single set of commands via the FC bus from the thermostat microcontroller. For example, a processor on the thermostat may send a command to the SSR switching IC 1302 that instructs the SSR switching IC 1302 to activate the cooling function. The digital control 1322 may then send separate commands to each of the multiple SSR circuits through their respective high-voltage isolation circuits 1316 to independently control each, briefly and periodically opening at least one of the SSR connections if power stealing is required.

This configuration in FIG. 19 may be advantageous in that it can reduced the number of SSR switching ICs 1302 that may be required for a particular application. For example, as shown in FIG. 7, as many as seven separate SSR switching ICs 1302 may be needed to replace the seven FET switches 706 if each IC includes only a single SSR circuit. In contrast, the number of SSR switching ICs 1302 may be cut in half or more if multiple SSR circuits are placed on each chip. It should be noted that the configuration illustrated in FIG. 19 is shown merely as an example and is not meant to be limiting. Specifically, the number of independent SSR circuits on each chip can number more than two. Each additional SSR circuit can be connected to the digital control 1322 via a serial bus such that the digital control 1322 can individually address each of the multiple SSR circuits on the chip. The individual communication may use enable lines, address lines, or dedicated communication lines to each SSR circuit.

Additionally, each of the multiple SSR circuits 1350 may include their own telemetry sensors and connections to the multiplexor 1320 and/or the ADC 1318. Thus, the performance characteristics of each of the SSR circuits can be simultaneously and independently captured and stored by the digital control 1322. In some embodiments, the multiplexor 1320 and ADC 1318 can be shared amongst the multiple SSR circuits, while in other embodiments each of the multiple SSR circuits may have its own dedicated multiplexor 1320 and ADC 1318.

Figure 20:
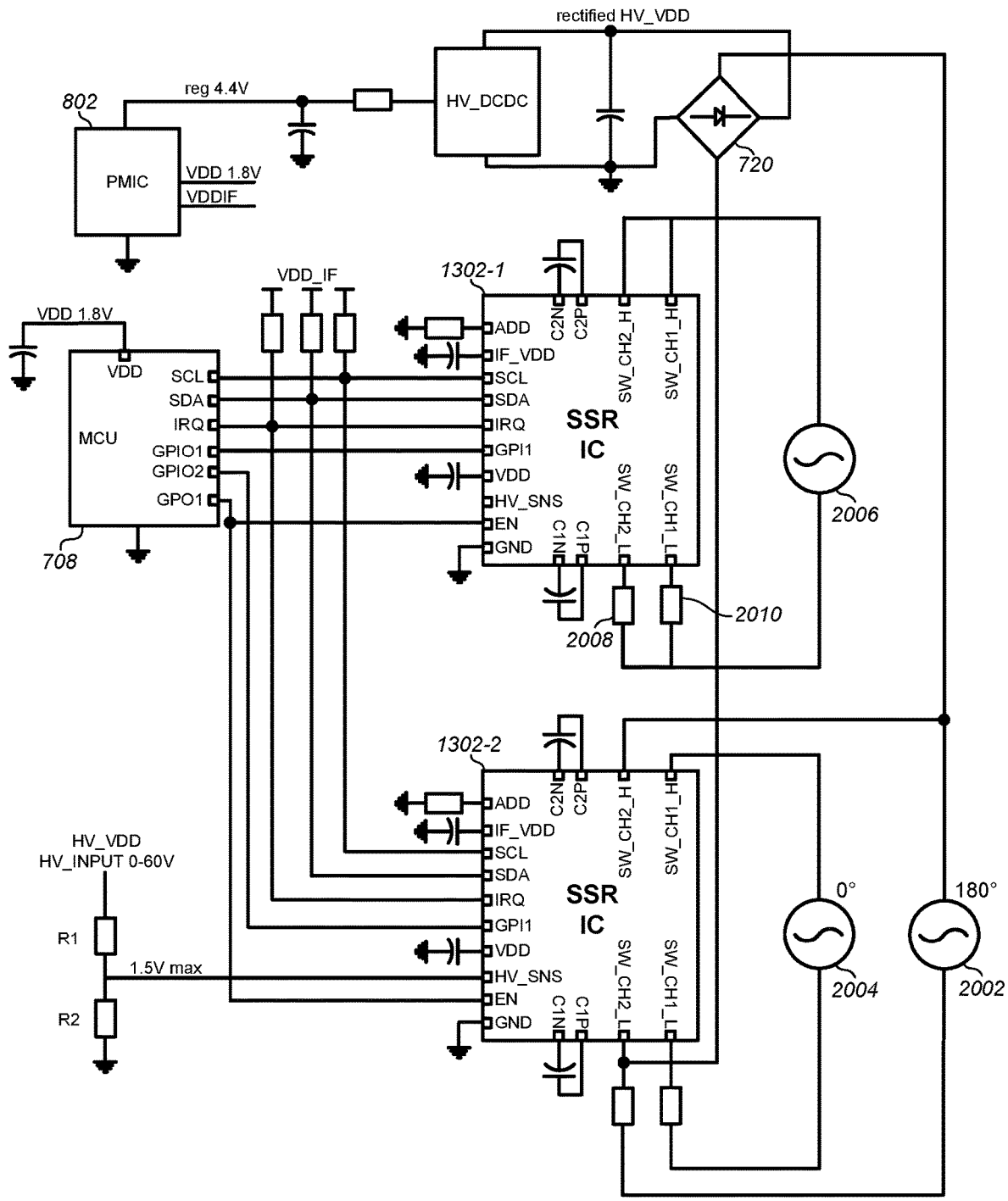
FIG. 20 illustrates a thermostat configuration that uses two SSR switching ICs 1302 to interface with HVAC systems having multiple transformers, according to some embodiments.

FIG. 20 illustrates a thermostat configuration that uses two SSR switching ICs 1302 to interface with HVAC systems having multiple transformers, according to some embodiments. Some HVAC systems may include two different triggering circuits, each having their own transformer. In the example described above, the HVAC system may include an HVAC function (e.g., cooling) that uses a first transformer 2004 and a second transformer 2002. As described above, the functions of each of these transformers 2004, 2002 can be controlled individually and independently by a single SSR switching IC 1302-2 via commands from the processors 708 of the thermostat through the serial bus. This offloads the control and complexity of the controlling the timing of the SSR operation from the processor 708 and abstracts the specifics of the particular switching technologies used to control the HVAC transformers from the processor. This allows for greater flexibility when selecting, upgrading, and programming processors for the thermostat. For example, offloading these functions to the SSR switching ICs 1302 allows for more power-efficient and/or low-cost processors to be used in the thermostat.

In some embodiments, the transformers 2004 and 2002 may be in phase with each other. However, in order to provide a robust design, the SSR switching IC 1302-2 having more than one SSR circuit may be designed to handle peak current and voltage signals for cases where the two transformers 2004, 2002 are 180° out-of-phase with respect to each other. For example, the first transformer 2014 may control the "W" wire of the HVAC system, while the second transformer 2002 may control the "Y" wire of the HVAC system. Each of these signals may normally be approximately a 24 VAC (RMS) waveform, which produces approximately 32V maximum RMS. This standard signal may also occasionally produce spikes having a peak voltage of 45V-55V. Therefore, the SSR switching IC 1302-2 may be designed to handle at least twice the 55V spikes, resulting in an SSR circuit that is robust against spikes exceeding 110V (e.g., 130V, 150V, 160V, 175V, 200V, etc.). Even though the FETs in the SSR circuit may not be exposed to this voltage-doubling effect, the shared isolation barrier for each of the SSR circuits may be. Therefore, the high-voltage isolation barrier and circuitry may be designed to handle the peak voltage for each individual transformer multiplied by the number of SSR circuits inside the shared isolation region.

As described above, the type of isolation barrier used in each of the SSR circuits can depend on the expected voltage/current signal ranges to which the barrier will be subjected during operation in each particular application. In the thermostat application described above, the expected voltages and currents in the dual SSR circuit configuration where the two transformers can be 180° out-of-phase with each other are low enough that normal high-voltage circuit components can be used to provide isolation, such as high-voltage FETs, on-die capacitive isolation, and level shifters. This is advantageous because it is a simple solution that can keep the cost per SSR switching IC 1302 relatively low. In other applications where a larger number of SSR circuits may share an isolation barrier or where higher voltage/current spikes may be anticipated, more robust voltage-isolation circuitry may be used, such as inductive isolation, RF isolation, optical isolation, and so forth.

FIG. 20 illustrates an SSR switching IC 1302-1 that is connected in parallel with the SSR switching IC 1302-2. Each of these SSR switching ICs 1302 may share the same serial bus from the microprocessor 708 of the thermostat. However, the SSR switching IC 1302-1 is only connected to a single transformer 2006 in the HVAC system. The single transformer 2006 has two separate relays 2008, 2010 that are each connected to one of the two input/output pins of the SSR switching IC 1302-1. In another configuration where the single transformer 2006 has only a single relay, each wire from the HVAC system can be connected to each of the available input and output pins of the SSR switching IC 1302-1. The digital control of the SSR switching IC 1302-1 can be instructed to send the same control signals to each of the SSR circuits such that they operate in unison. This configuration also splits the current between each of the multiple SSR circuits in the SSR switching IC 1302-1.

Figure 21:
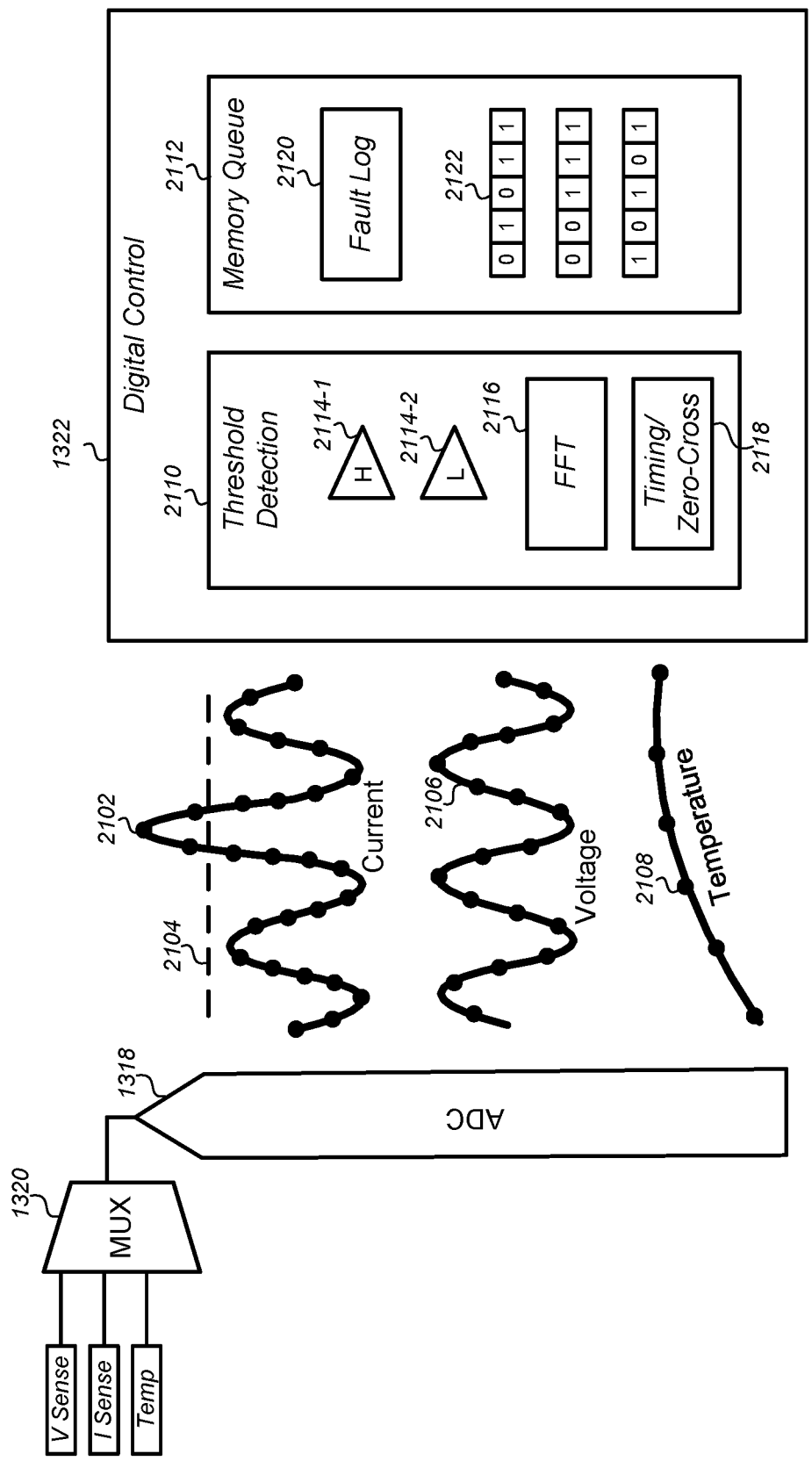
FIG. 21 illustrates a block diagram of how telemetry data can be saved and recorded from each of the SSR circuits, according to some embodiments.

FIG. 21 illustrates a block diagram of how telemetry data can be saved and recorded from each of the SSR circuits, according to some embodiments. As described above, each of the SSR circuits may include various telemetry sensors embedded in the IC near the actual switches. These sensors may include circuits for sensing voltage measurements across the switches, current measurements through the switches, temperature measurements in the silicon surrounding the switches, and so forth. These sensors can receive analog measurements and provide analog signals to the multiplexor 1320. The multiplexor can cycle through each of its inputs, sequentially selecting each of the telemetry inputs based on a conversion cycle time of the ADC. The ADC can be programmed to successively and continuously convert the analog measurements from the sensors into a digital form that the digital control of the SSR switching IC 1302 can receive. In some embodiments, each sensor may have its own dedicated ADC such that readings from each sensor can truly be captured in parallel. Some embodiments may also include other sensors other than those shown in FIG. 21.

The ADC 1318 can provide a time series of samples 2102, 2106, 2108 to the digital control 1322 for each of the monitored sensors. In some embodiments, the digital control 1322 can receive the time series of samples 2102, 2106, 2108 and store the samples in a memory 2112. The memory 2112 may operate as a FIFO queue, saving samples until an amount of memory allocated for each particular sensor is full, then writing over the oldest samples to maintain a sliding window 2122 of samples with a window length that is proportional to the size of the allocated memory. The contents of the memory 2112 can be used to create a history log of operations for each sensor. Even during normal operations during which no faults are detected, this history log can be used to characterize operation of the SSRs, to test new software techniques for operating the digital control 1322, to diagnose and detect intermittent problems, to anonymously aggregate data characterizing the install base of an HVAC system, and/or to detect changes in system operation over time.

In some embodiments, the digital control 1322 may include a threshold detection circuit that can be used to detect electrical anomalies in real time. The threshold detection circuit may include digital thresholds 2114 to which the digital samples can be compared as they are received. For example, a digital threshold 2104 may be used for the voltage/current to detect over-voltage/current spikes that could damage the circuitry of the SSR switching IC 1302. Other digital thresholds may be used to detect over-temperature situations. Some embodiments may require a certain number of consecutive samples above the threshold before classifying the event as an over-current/voltage spike in order to act as a low-pass filter on the samples and thereby filter out brief transient signals that do not risk causing damage. When the digital control 1322 detects an over-current/voltage condition of a sufficient duration, the digital control 1322 can open the SSRs to prevent damage from being inflicted on the SSR switching IC 1302. Generally, the silicon region of the SSR switching IC 1302 inside the high-voltage isolation barrier can be designed to handle voltage/current levels and heat buildup that may be reasonably expected in to occur in an HVAC system for a short duration that is longer than the time it takes to detect these anomalies and turn of the SSRs.

The threshold detection circuit 2110 may also include threshold detection that is more advanced than simple digital thresholds. For example, the threshold detection circuit may include a fast-Fourier transform (FFT) module 2116 that can be used to perform a frequency analysis of the time series of samples 2102, 2106, 2108 to detect and/or record frequencies that are outside of a normal operating range. The threshold module may also use the samples 2102, 2106, 2108 to detect zero-crossings 2118. In some embodiments, the zero-crossings can be used to time the turning on/off of the SSRs when activating/deactivating an HVAC function and/or temporarily turning of the SSRs during an HVAC function to enable power stealing. By switching the SSRs off to coincide with zero-crossings of the 24 VAC HVAC signal, the stress of absorbing excess current that is generated by interrupting the inductive transformer of the HVAC system can be effectively minimized. In some embodiments, the gate control of each of the SSR circuits can instead be configured to turn the SSRs off at zero-crossings rather than turning off immediately. Alternatively, if the SSR switching IC is installed in a DC system, the SSRs can be turned off immediately upon detecting a fault.

As described above, the memory will capture a real-time waveform represented by digital samples of the different sensor measurements. The memory 2112 can also store statistical information, such as a high/low for each sensor, average values, average frequencies, and so forth. The memory 2112 may also include a fault log 2120 that records the time and conditions surrounding a fault event. The fault log 2120 can store the fault conditions (thresholds, max/min measured values, timing, etc.) along with the actual raw waveform data surrounding the fault. In some embodiments, in order to conserve memory, the historical window of waveform data may be relatively small (e.g., 1 hour, 6 hours, 12 hours, 24 hours, 1 week, 1 month). Although continuously monitored and recorded, the waveform samples 2102, 2106, 2108 can be discarded unless a fault event is detected in the time period surrounding those samples. For example, the waveform data for each hour can be discarded unless a fault is detected at some point in that hour, in which case the waveform in the hour window surrounding the fault can be saved to the memory 2112. In other embodiments, all waveform data may be saved until the memory 2112 is full and the oldest data are overwritten. In some embodiments, relatively small memory modules may be used by the SSR switching ICs. For example, one memory may only cover about 30 ms of samples. To aggregate more samples than the memory can accommodate, the secondary processor can periodically (e.g., every 20 ms) read out the SSR switching IC memory and store the data in the secondary processor's memory, which will generally be much larger. In some cases, the secondary processor may be configured to only read out data from the SSR switching IC memory when faults or anomalies are detected. In some embodiments, the secondary processor may also regularly read out data from the SSR switching IC memory for long-term analysis, even in the absence of a detected fault.

Figure 22:
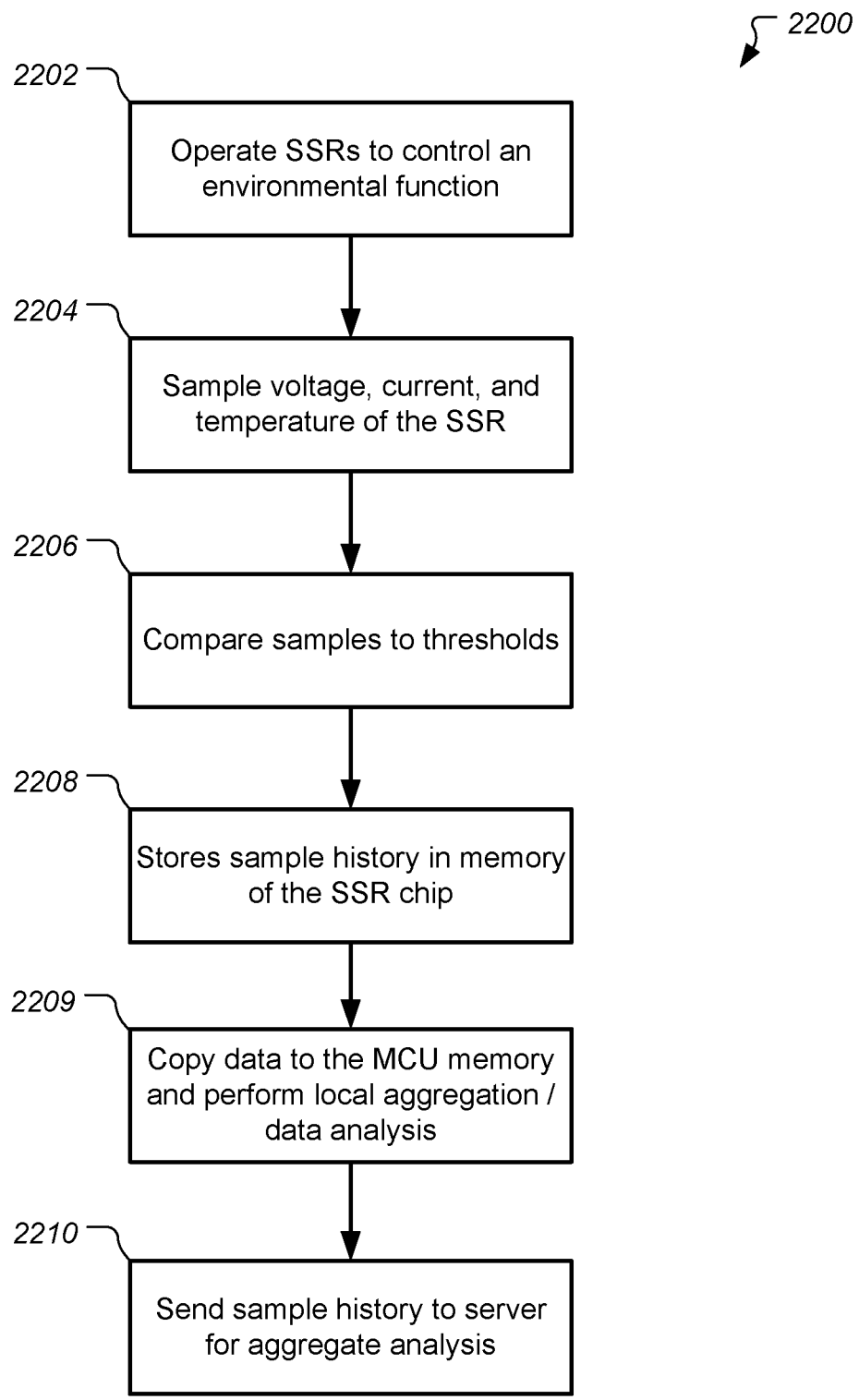
FIG. 22 illustrates a flowchart of a method for using telemetry data from an SSR switching IC to monitor performance, according to some embodiments.

FIG. 22 illustrates a flowchart 2200 of a method for using telemetry data from an SSR switching IC to monitor performance, according to some embodiments. The method may include operating the SSRs to control an environmental function (2202). The SSRs may be operated using the SSR switching IC described in detail above. The SSR switching IC may include voltage/current/temperature sensors close to the SSRs. The method may also include sampling the sensor measurements continuously over time to monitor the operating characteristics of the SSRs while chip is being used in an actual installed application. In some embodiments, the method may additionally include comparing the samples to various thresholds in real-time as described above (2206), and storing a history of the waveform samples in a memory device of the SSR switching IC (2208).

The method may further include copying the data from the SSR switching IC memory to the local MCU memory for local aggregation, comparison to thresholds, and/or other data analysis (2209). Specifically, the data from the SSR switching IC memory can be transferred first to the secondary processor's memory, then to larger memory in the primary processor. As will be described in detail below, the telemetry data received from the SSR sampling circuits can be used in comparison to thresholds to detect voltage/current/temperature anomalies. This data can also be aggregated to detect data trends that happen over time. For example, temperature data can be aggregated to monitor the self-heating of the device for use in calculating an accurate and compensated ambient temperature from the thermostat temperature sensor measurements that might be affected by internal heating. In another example, aggregating voltage/current data can be used to characterize a variety different types of HVAC systems with which the thermostat may be installed. For example, the data may be used to detect when an HVAC system is beginning to fail by detecting changing operating characteristics over time. This processing may take place locally at the SSR switching IC, on the thermostat processor, and/or remotely at a thermostat server.

In some embodiments, the method may additionally include sending the sample history to a server for aggregate analysis (2210). In the example of a thermostat, the thermostat may be configured to communicate over the Internet with a remote thermostat management server that monitors the operation of a collection of thermostats. The thermostat server may be operated by an entity that designs and/or manufactures the thermostats (e.g., Nest Labs®). In some embodiments, the thermostat may communicate regularly (e.g., nightly, every 30 min, every 60 min, each time the primary processor or user interface wakes up, etc.) with the thermostat server to receive software updates and new operating parameters, and to provide the thermostat server with diagnostic data that can be used to study and refine the software running on the thermostat. The sample history from the SSR switching IC can be sent from the thermostat to the thermostat server as part of the nightly data upload.

From the perspective of the remote server, data can be collected from a large number of SSR switching ICs that are part of many different devices that are distributed over a wide geographic area. These devices may be installed in many different regions around a country and may be subjected to many different types of operating environments. Therefore, the data collected from these different SSR switching ICs can provide diagnostic information that can be used to thoroughly test and evaluate current and future versions of the software that operates on the SSR switching ICs and inform future hardware designs and factory test procedures. Specifically, the digital control of the SSR switching ICs may store software instructions and different parameter values that control how the SSR switching IC handles commands from an external microprocessor (e.g., the thermostat processor) to operate the internal SSRs. This software in the SSR switching IC can be installed and updated by downloading a software package from the thermostat server to the thermostat. The thermostat processor can then install/replace the software in the SSR switching IC by programming the digital control and/or the software in the gate drivers via the serial bus of the SSR switching IC. This installation/updating of the SSR switching IC software can be done while the SSR switching IC is installed and operating in the thermostat in a user's home without interrupting the normal operation of the thermostat.

The data aggregated from the SSR switching ICs from multiple thermostats can used by the thermostat server for many different purposes. In some embodiments, the data collected from the ICs can be used to test new versions of the software that operates on the SSR switching ICs. The waveform samples collected from the thermostats can be used as input data for new circuits and/or software versions such that can be tested with large-scale, real-world data. Normally, the new software and/or circuits would be tested using standalone thermostats in a controlled environment. Using the aggregated waveform data from a population of thermostats can provide a real-world framework for simulating circuit and the software responses to actual voltage/current anomalies that occur in the field. New software can be tested against the collected data in a limited run before distribution to the wider thermostat population. This can reduce development time for new software versions and can increase the reliability of software once released. New software can be downloaded to the thermostat while it is operating in a user's home. The software may update instructions or parameter values that are stored and executed on the SSR switching IC itself. The software download may also change the way in which the primary/secondary processor interacts with the SSR switching IC.

In some embodiments, the data aggregated from the SSR switching ICs can be analyzed to identify previously unknown electrical anomalies. The thermostats in the field will generally have threshold and waveform limits set to detect known voltage/current anomalies (e.g., over-current/voltage). What can often be missed are "near-anomalies" where the predetermined thresholds are not triggered, but which may still cause excessive heat buildup in the silicon IC. For example, a large pulse of current that lasts for more than a couple of AC cycles may not cross the current threshold, yet may still cause excessive heat buildup. Even in cases where the thresholds are tripped, having the waveform data can provide a precise and clear picture of what voltage/current waveforms were experienced by the SSR switching IC. These waveforms can be used to generate new circuit solutions in the future that address the types of electrical anomalies that the thermostats are exposed to in typical installations.

In some embodiments, the aggregated data can be analyzed by the thermostat server to identify subsets of the thermostat population that are experiencing isolated problems. Aggregated data can also be used to analyze subsets of the thermostat population that can be grouped according to geographic or environmental characteristics, such as customers on the same power substation, customers in the same area of overhead wires, customers connected to the same utility companies, customers located in areas experiencing strong storm patterns, customers in the same neighborhood, ZIP code, city and so forth. For example, the uploaded data may reveal that thermostats installed in homes with a certain brand of HVAC system experience different types of electrical anomalies (e.g., current surges) then the anomalies experienced by the rest of the population. New software versions for the SSR switching IC can be developed to handle these specific anomalies that only apply to certain thermostats. Then, the new software versions can be downloaded to the specific thermostats that are likely to be exposed to similar anomalies. For example, a specific version of the SSR switching IC software can be downloaded to thermostats that are paired with both primary and secondary heating functions, thermostats paired with a certain brand of HVAC system, thermostats installed in homes with wiring that is older than a predetermined date, thermostats installed in homes with a thermal retention characteristic below a certain level, and so forth.

Figure 23:
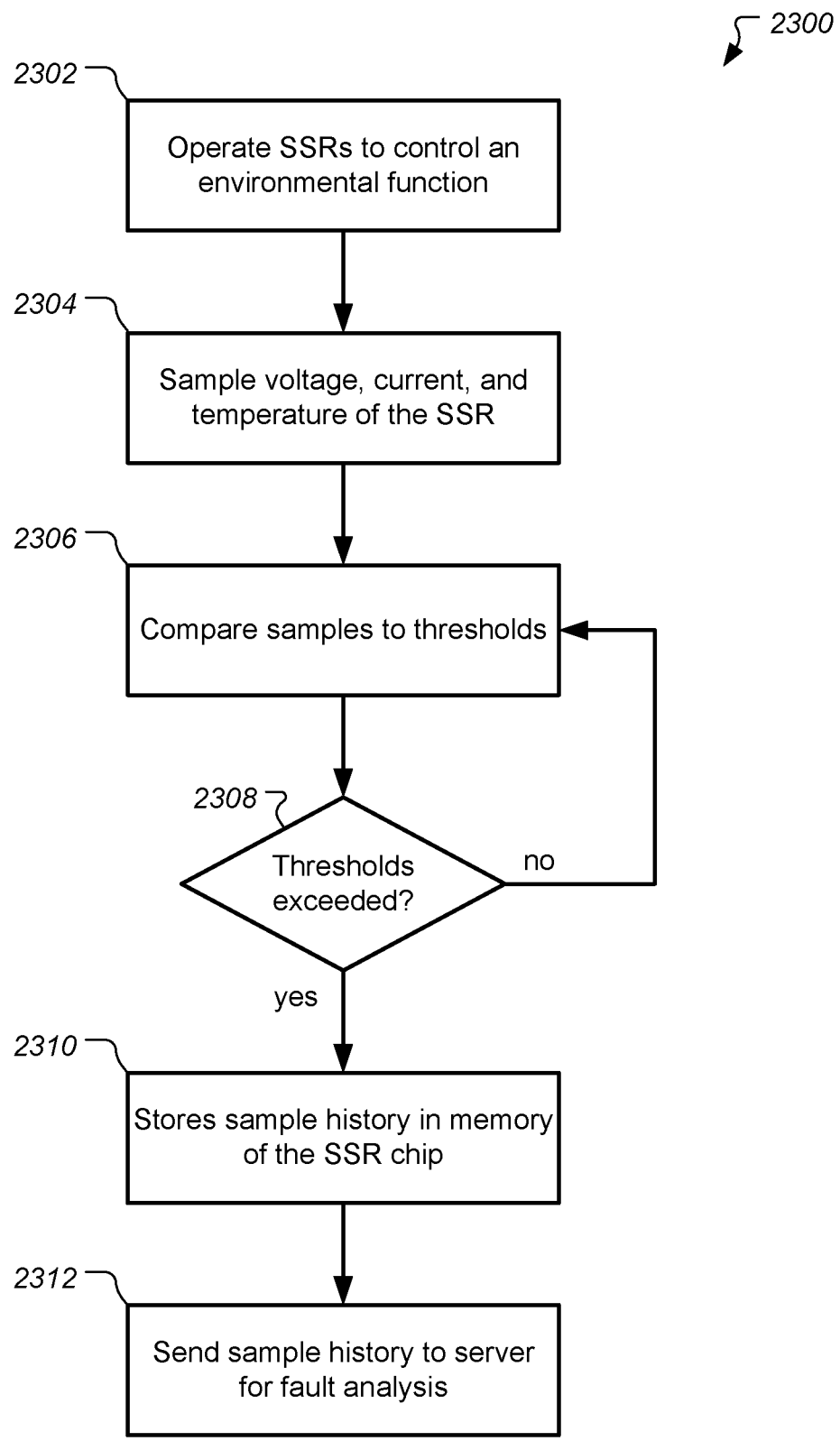
FIG. 23 illustrates a flowchart of a method for triggering waveform sample storage using predetermined thresholds, according to some embodiments.

FIG. 23 illustrates a flowchart 2300 of a method for triggering waveform sample storage using predetermined thresholds, according to some embodiments. As described briefly above, some actions performed by the telemetry system of the SSR switching IC can be triggered based on events, such as thresholds being exceeded or waveform patterns being detected. The method may include operating the SSR switching ICs to control an environmental function (2302), sampling voltage, current, temperature, etc., of the SSR switching ICs (2304), and comparing those samples to various thresholds (2306). These thresholds can include digital thresholds, analog thresholds, frequency thresholds, expected waveforms, power thresholds, and so forth. Exceeding or violating these thresholds can then trigger additional actions by the SSR switching IC or the thermostat processor.

For example, the method may include storing a sample history in the memory of the SSR switching IC to capture a sampled waveform surrounding the threshold violation (2310). In this case, the SSR switching IC can continually monitor the waveforms, storing samples for only a brief period of time (e.g., 30-40 ms). When a threshold violation occurs, the stored samples captured before the violation can be saved, along with an interval of samples captured after the violation. In embodiments where the SSR switching IC memory is relatively small, the samples can be repeatedly transferred to the secondary processor memory to thereby store a continuous stream of data that would otherwise be too large for the SSR switching IC memory. In other embodiments, the samples can be continuously saved as described above, but when a threshold violation occurs, the sensor inputs can be sampled at a higher rate or stored at a higher resolution to provide additional data surrounding the threshold violation.

The method may also include sending the sample history to the thermostat server for fault analysis (2312). Instead of waiting for a nightly upload, the samples in the time window surrounding the threshold violation can be uploaded to the thermostat server for analysis. While fault detection can result in an immediate output on the user interface of the thermostat, additional analysis can be performed at the thermostat server. For instance, the thermostat server can compare the waveforms from a first thermostat with a library of waveforms for known types of electrical faults. These waveforms can be used to diagnose what went wrong in a particular thermostat, and can then trigger a software update, a notification to the user, and/or other action by the server.

What is claimed is:

1. A smart-home device comprising:
   a solid state relay (SSR) switching integrated circuit (IC) comprising:
   one or more switching elements configured to open and close a connection between a power wire and a return wire of an environmental system;
   a voltage sensor that measures a voltage across the one or more switching elements;
   a current sensor that measures a current through the one or more switching elements;
   a temperature sensor that measures a temperature near the one or more switching elements; and
   a memory that stores voltage, current, or temperature data for a time window of at least 20 milliseconds;
   a wireless communication device that periodically receives voltage, current, or temperature data originating from the SSR switching IC and transmits the voltage, current, or temperature data to a device management server;
   wherein the device management server receives batches of voltage, current, or temperature data from a plurality of smart-home devices.

2. The smart-home device of claim 1, the SSR IC further comprises a analog-to-digital converter (ADC) and a multiplexer, wherein outputs from the voltage sensor, the current sensor, or the temperature sensor are individually selected by the multiplexer for conversion by the ADC.

3. The smart-home device of claim 1, wherein the smart-home device further comprises a main processor, wherein the SSR switching IC periodically transfers the voltage, current, or temperature data from the memory of the SSR switching IC to the main processor, and the main processor periodically transfers the voltage, current, or temperature data to the wireless communication device.

4. The smart-home device of claim 1, wherein the one or more switching elements are configured to connect to a first transformer of the environmental system.

5. The smart-home device of claim 4, wherein the SSR switching IC further comprises second one or more switching elements configured to connect to a second transformer of the environmental system.

6. The smart-home device of claim 5, wherein the first transformer and the second transformer are 180° out of phase.

7. The smart-home device of claim 1, wherein the SSR switching IC further comprises a threshold detection circuit wherein the voltage, current, or temperature data originating from the SSR switching IC is collected in response to a detected threshold violation.

8. The smart-home device of claim 1, wherein the voltage, current, or temperature data indicates an over-current or over-voltage event.

9. The smart-home device of claim 8, wherein the wireless communication device receives a software update from the device management server for operation of the SSR switching IC to correct the over-current or over-voltage event.

10. The smart-home device of claim 9, wherein the software update is sent to a subset of the plurality of smart-home devices for which the batches of voltage, current, or temperature data indicate similar over-current or over-voltage events.

11. A method of monitoring and correcting electrical anomalies in a smart-home device, the method comprising:
    opening or closing a connection between a power wire and a return wire of an environmental system using one or more switching elements of a solid state relay (SSR) switching integrated circuit (IC) on the smart-home device;
    measuring one or more of:
        a voltage across the one or more switching elements using a voltage sensor of the SSR switching IC;
        a current through the one or more switching elements using a current sensor of the SSR switching IC; or
        a temperature near the one or more switching elements using a temperature sensor of the SSR switching IC;
    storing voltage, current, or temperature data for a time window of at least 20 milliseconds in a memory of the SSR switching IC; and
    transmitting voltage, current, or temperature data originating from the SSR switching IC to a device management server using a wireless communication device of the smart-home device;
    wherein the device management server receives batches of voltage, current, or temperature data from a plurality of smart-home devices.

12. The method of claim 11, wherein the smart-home device comprises a main processor, wherein the SSR switching IC periodically transfers the voltage, current, or temperature data from the memory of the SSR switching IC to the main processor, and the main processor periodically transfers the voltage, current, and temperature data to the wireless communication device.

13. The method of claim 11, wherein the one or more switching elements are configured to connect to a first transformer of the environmental system.

14. The method of claim 13, wherein the SSR switching IC comprises second one or more switching elements configured to connect to a second transformer of the environmental system.

15. The method of claim 11, wherein the S SR switching IC further comprises a threshold detection circuit wherein the voltage, current, or temperature data originating from the SSR IC is collected in response to a detected threshold violation.

16. The method of claim 11, wherein the voltage, current, or temperature data indicates an over-current or over-voltage event.

17. The method of claim 16, wherein the wireless communication device receives a software update from the device management server for operation of the SSR switching IC to correct the over-current or over-voltage event.

18. The method of claim 17, wherein the software update is sent to a subset of the plurality of smart-home devices for which the batches of voltage, current, or temperature data indicate similar over-current or over-voltage events.

19. The method of claim 11, wherein the smart-home device comprises a thermostat, the environmental system comprises a heating, ventilation, and air conditioning (HVAC) system, and the SSR switching IC is part of a power circuit of the thermostat.

20. The smart-home device of claim 1, wherein the smart-home device comprises a thermostat, the environmental system comprises an HVAC system, and the SSR switching IC is part of a power circuit of the thermostat.

* * * * *